(12) United States Patent
Murayama et al.

(10) Patent No.: US 8,148,738 B2
(45) Date of Patent: Apr. 3, 2012

(54) SEMICONDUCTOR DEVICE HAVING AN ELEMENT MOUNTED ON A SUBSTRATE AND AN ELECTRICAL COMPONENT CONNECTED TO THE ELEMENT

(75) Inventors: Kei Murayama, Nagano (JP);
Mitsutoshi Higashi, Nagano (JP);
Naoyuki Koizumi, Nagano (JP); Yuichi Taguchi, Nagano (JP); Akinori Shiraishi, Nagano (JP); Masahiro Sunohara, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 55 days.

(21) Appl. No.: 11/812,149

(22) Filed: Jun. 15, 2007

(65) Prior Publication Data
US 2007/0290329 A1    Dec. 20, 2007

(30) Foreign Application Priority Data

Jun. 16, 2006    (JP) .............................. P.2006-168166

(51) Int. Cl.
*H01L 31/12* (2006.01)
(52) U.S. Cl. .............. 257/84; 257/93; 257/98; 257/778; 257/E25.032
(58) Field of Classification Search .............. 257/84, 257/93, E25.032
See application file for complete search history.

(56) References Cited

U.S. PATENT DOCUMENTS

| | | | | |
|---|---|---|---|---|
| 6,054,716 A * | 4/2000 | Sonobe et al. | ................ | 250/552 |
| 6,713,877 B2 * | 3/2004 | Hirano et al. | ................. | 257/778 |
| 6,841,931 B2 * | 1/2005 | Takahashi et al. | ............ | 313/500 |
| 6,876,008 B2 * | 4/2005 | Bhat et al. | ........................ | 257/99 |
| 7,402,842 B2 * | 7/2008 | Goodrich | ........................ | 257/99 |
| 2005/0121686 A1 * | 6/2005 | Keller et al. | .................... | 257/99 |
| 2006/0006404 A1 * | 1/2006 | Ibbetson et al. | ................ | 257/99 |
| 2006/0261364 A1 * | 11/2006 | Suehiro et al. | ................ | 257/100 |
| 2007/0252523 A1 * | 11/2007 | Maeda et al. | ................. | 313/506 |
| 2008/0036362 A1 * | 2/2008 | Tanimoto et al. | ............. | 313/498 |

FOREIGN PATENT DOCUMENTS

| | | | |
|---|---|---|---|
| JP | 2000-077722 | | 3/2000 |
| WO | WO 2006/054616 | * | 5/2006 |
| WO | WO 2006/054616 A1 | | 5/2006 |

* cited by examiner

*Primary Examiner* — Wael Fahmy
*Assistant Examiner* — John C Ingham
(74) *Attorney, Agent, or Firm* — Drinker Biddle & Reath LLP

(57) ABSTRACT

In a semiconductor device 100, a light emitting element 120 has been mounted on an upper plane of a semiconductor substrate 102. In an impurity diffusion region of the semiconductor substrate 102, a P conducting type of a layer 104, and an N layer 106 have been formed, while an N conducting type impurity is implanted to the P layer 104, and then the implanted impurity is diffused to constitute the N layer 106. A zener diode 108 made of a semiconductor device has been formed by the P layer 104 and the N layer 106.

12 Claims, 24 Drawing Sheets

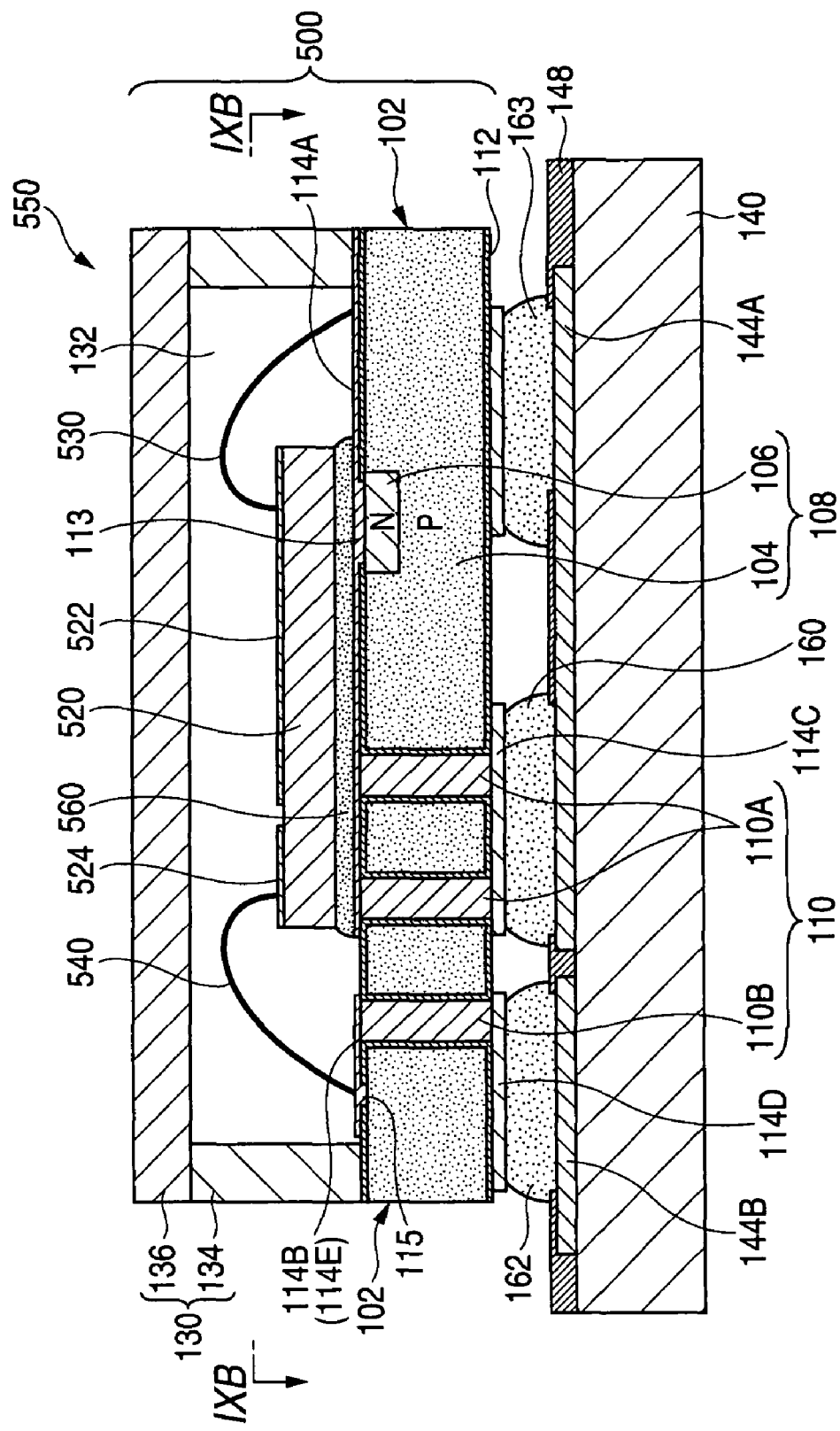

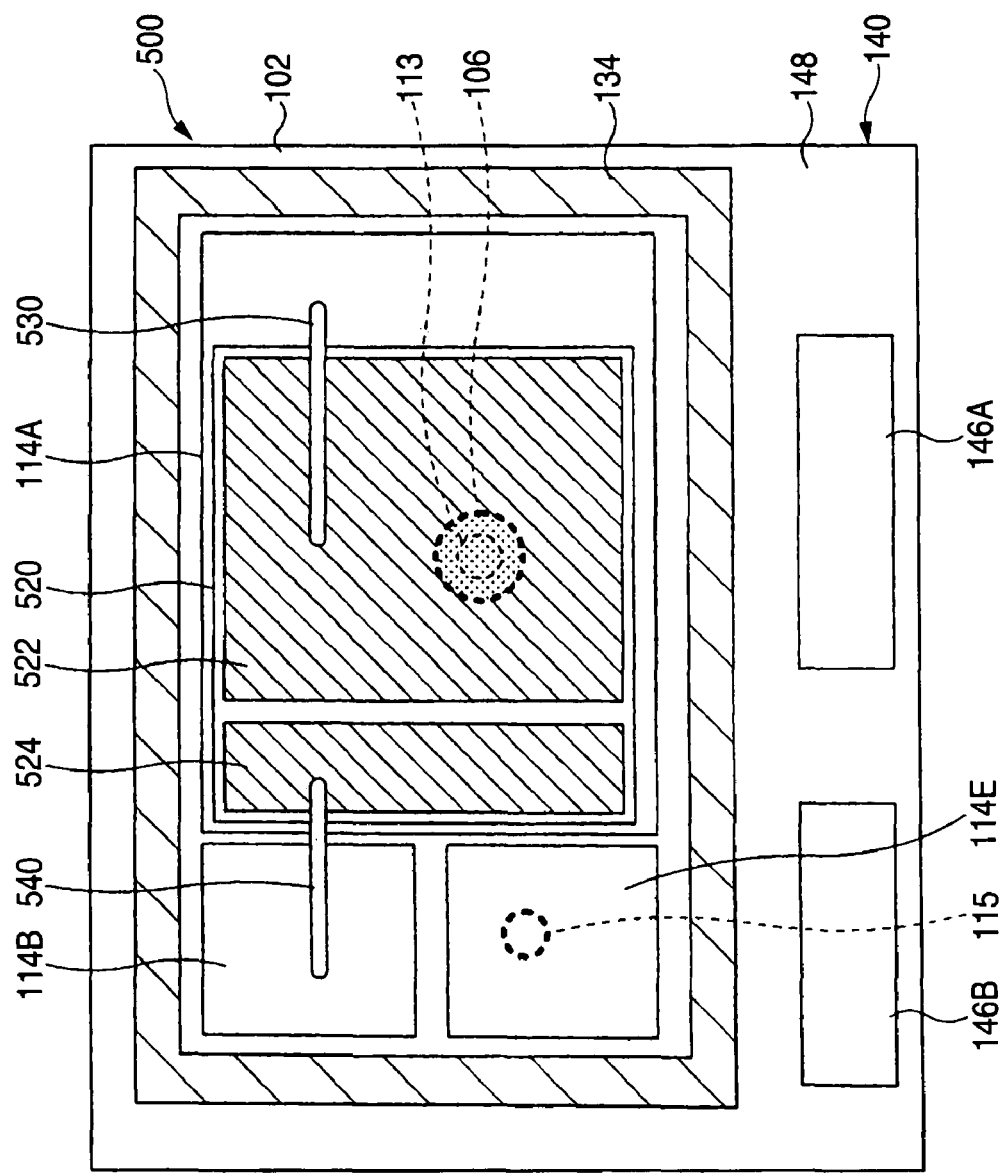

SEMICONDUCTOR DEVICE HAVING AN ELEMENT MOUNTED ON A SUBSTRATE AND AN ELECTRICAL COMPONENT CONNECTED TO THE ELEMENT

BACKGROUND OF THE INVENTION

The present invention is related to a semiconductor device and a method of manufacturing the semiconductor device. More specifically, the present invention is directed to such a semiconductor device equipped with an element mounted on a substrate and an electronic component connected to the element, and also, directed to a method for manufacturing such a semiconductor device.

For example, in the case where a light emitting element constructed of an LED (light emitting diode) is mounted on a substrate, in order to avoid that a high voltage caused by electrostatic energy is applied to the light emitting element, a zener diode is connected to the light emitting element, so that the light emitting element is protected (refer to, for instance, patent publication 1).

FIG. 1 is a longitudinal sectional view for representing one example as to conventional semiconductor devices. As indicated in FIG. 1, a semiconductor device 10 has been manufactured as follow: a zener diode 14 is fixed on a substrate 12 by an adhesive 15. The substrate 12 is made of either a resin material or ceramics; a light emitting element (LED) 16 is connected to a terminal of an upper plane of the zener diode 14 by employing a soldering bump under such a condition that this light emitting element 16 is stacked on the zener diode 14; and thereafter, both the zener diode 14 and the light emitting element 16 are sealed by a resin material 18 having an optical transmitting characteristic. Then, wires 20 drawn from the zener diode 14 are connected to penetration electrodes 22, and furthermore, terminals 24 elongated downwardly from the penetration electrodes 22 are projected from a lower plane of the substrate 12.

[Patent Publication 1]
JP-A-2000-77722

In the above-described conventional structure, the zener diode 14 having the larger dimension than that of the light emitting element 16 is mounted on the substrate 12, and the light emitting element 16 is stacked on the larger zener diode 14. As a result, the conventional semiconductor device can be hardly made compact. Moreover, such a space where the wires 20 are connected is required outside the light emitting element 16, and the penetration electrodes 22 are arranged outside the zener diode 14. As a result, there is a problem that the installation space (area) becomes very large, as compared with the dimension of the light emitting element 16.

SUMMARY OF THE INVENTION

The present invention has been made to take account of the above-described problems, and therefore, has an object to provide a semiconductor device capable of solving the above-explained problems, and also to provide a method for manufacturing the semiconductor device.

To solve the above-described problems, the present invention is comprised of the below-mentioned means.

According to the present invention, there is provided a semiconductor device including:

a substrate; and an electronic component mounted on the substrate, wherein the substrate is a semiconductor substrate; and a region of a semiconductor element formed in an impurity diffusion region of the semiconductor substrate is electrically connected to the electronic component.

It is preferable that the semiconductor element is formed by at least two regions having different conductivity types.

It is preferable that the semiconductor element is a zener diode capable of avoiding that a voltage higher or equal to a predetermined voltage is applied to the electronic component.

It is preferable that a plurality of penetration electrodes, which are electrically connected to the electronic component, are formed in the semiconductor substrate;

the plurality of penetration electrodes includes;

a first penetration electrode which is connected to a first electrode of the electronic component, and a second penetration electrode which is connected to a second electrode of the electronic component.

It is preferable that a first region of the semiconductor element is connected to the first electrode, and a second region of the semiconductor element is connected to the second electrode.

It is preferable that the semiconductor substrate is a silicon substrate.

It is preferable that the electronic component is sealed on the substrate by a sealing structural member provided with an optical transmitting plane having an optical transmitting characteristic.

Further, there is provided a method of manufacturing a semiconductor device in which an electronic component is mounted on a substrate, including a step for forming the substrate by a semiconductor substrate;

a step for forming a region for constructing a semiconductor element in an impurity diffusion region of the semiconductor substrate;

a step for forming a wiring layer on the semiconductor substrate, the wiring layer being electrically connected to the semiconductor element; and a step for connecting the electronic component to the wiring layer.

It is preferable that the semiconductor device manufacturing method further includes:

a step for forming a plurality of penetration electrodes in the semiconductor substrate, the penetration electrodes being electrically connected to the electronic component.

It is preferable that the semiconductor device manufacturing method further includes:

a step for sealing the electronic component on the substrate by an optical transmitting member having an optical transmitting characteristic.

In accordance with the semiconductor device of the present invention, the substrate is formed by the semiconductor substrate, and the semiconductor element formed in the impurity diffusion region of the semiconductor substrate is electrically connected to the electronic component. As a result, the semiconductor device of the present invention can be largely made compact and further the installation space thereof can be largely reduced, as compared with the conventional semiconductor device formed by mounting the zener diode on the substrate.

BRIEF DESCRIPTION OF THE DRAWINGS

FIG. 9A is a longitudinal sectional view for showing an embodiment 5 of a semiconductor device according to the present invention.

FIG. 9B is a lateral sectional view for indicating the semiconductor device, taken along a line IXB-IXB indicated in FIG. 9A.

DETAILED DESCRIPTION OF THE PREFERRED EMBODIMENTS

Referring now to drawings, best modes for carrying out the present invention will be described.

[Embodiment 1]

Figure 1:
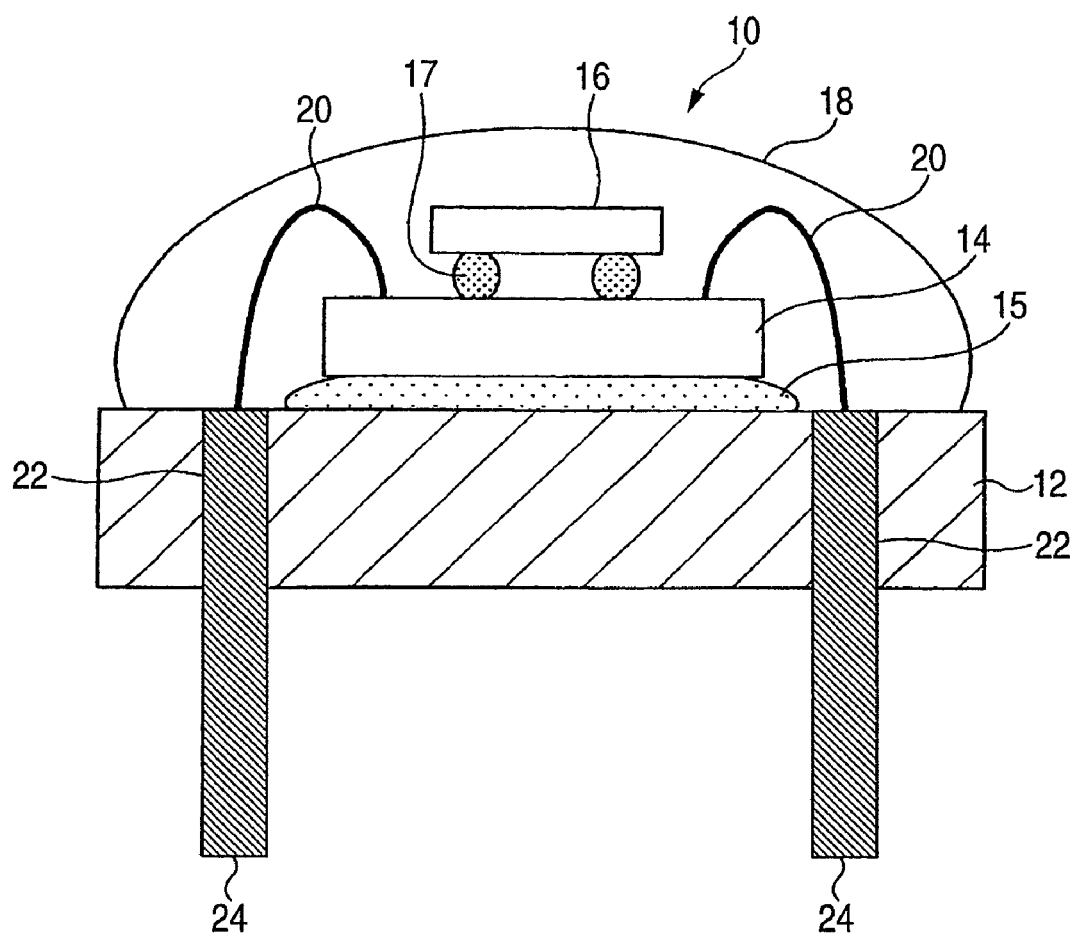
FIG. 1 is a longitudinal sectional view for showing one example of the conventional semiconductor device.
Figure 2:
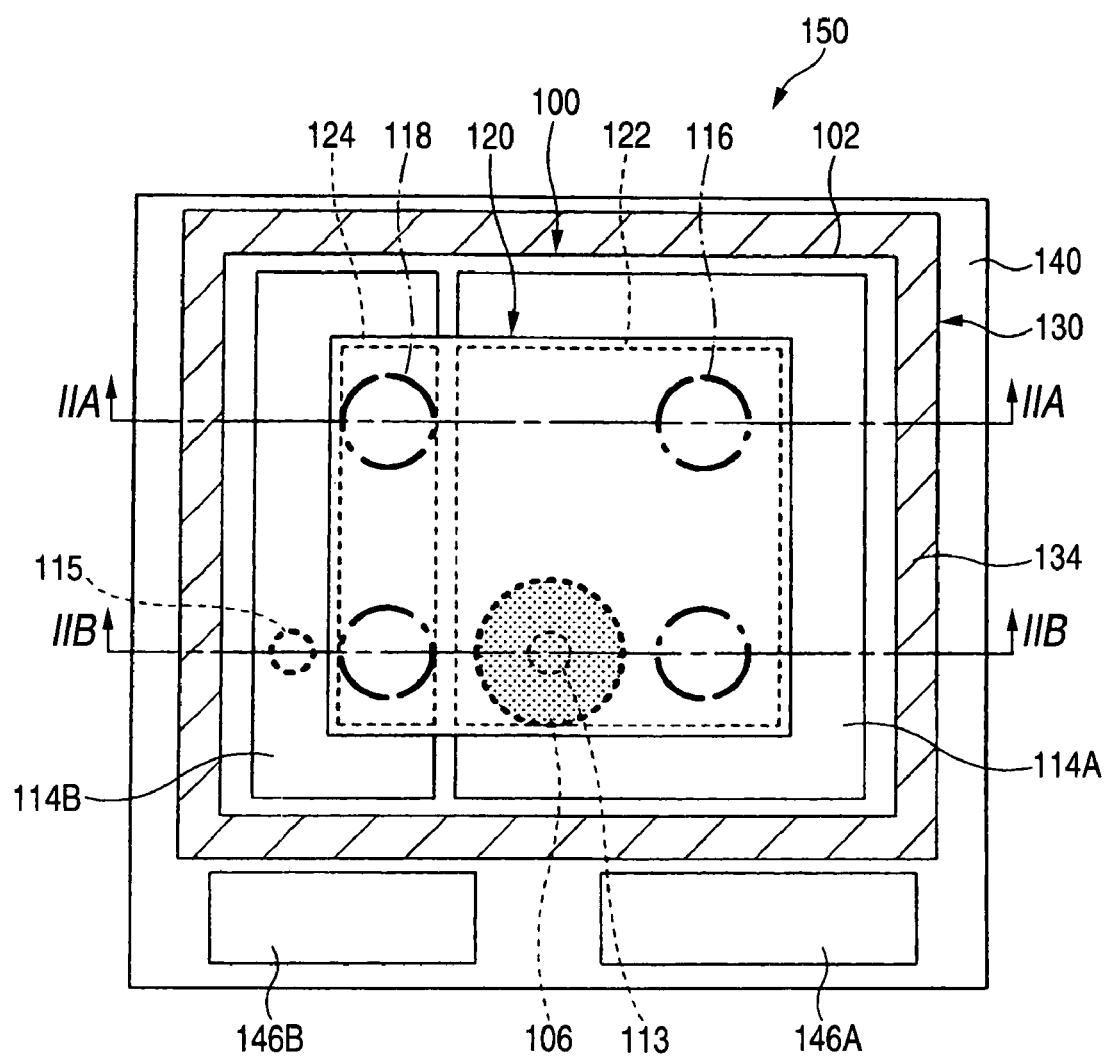
FIG. 2 is a plan view for showing an embodiment 1 of a semiconductor device according to the present invention.
Figure 3A:
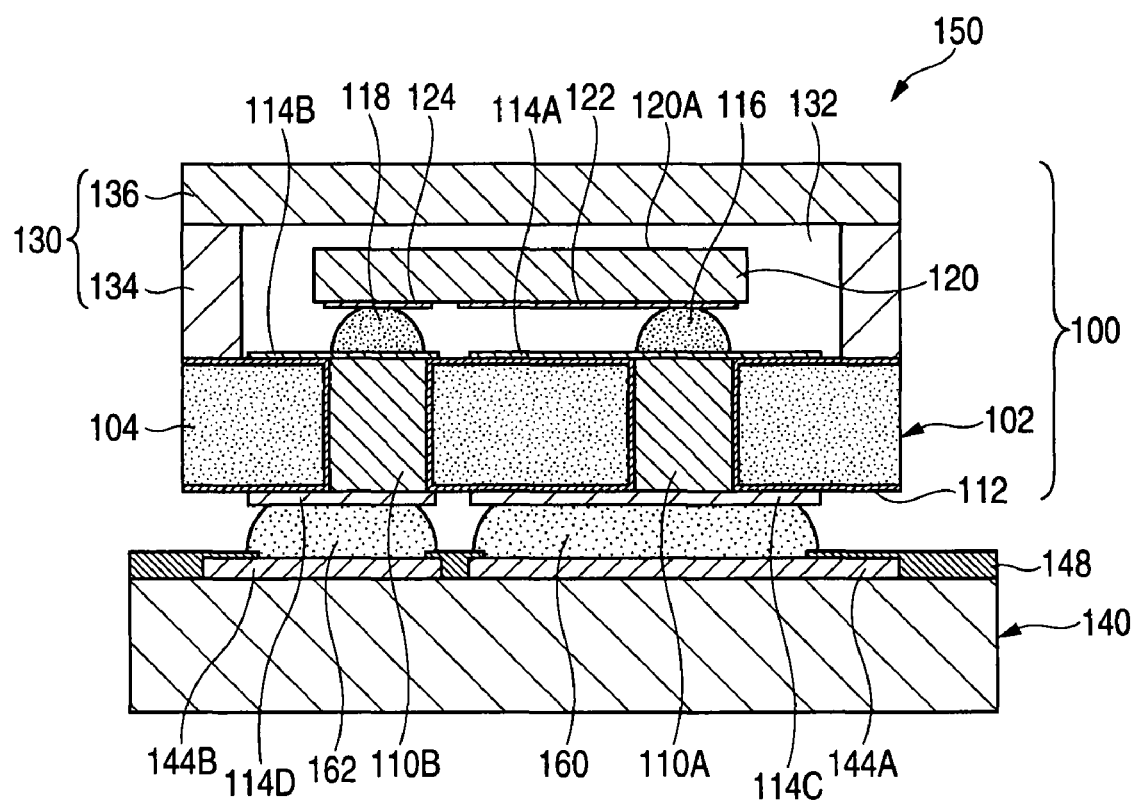
FIG. 3A is a longitudinal sectional view, taken along a ling IIA-IIA indicated in FIG. 2.
Figure 3B:
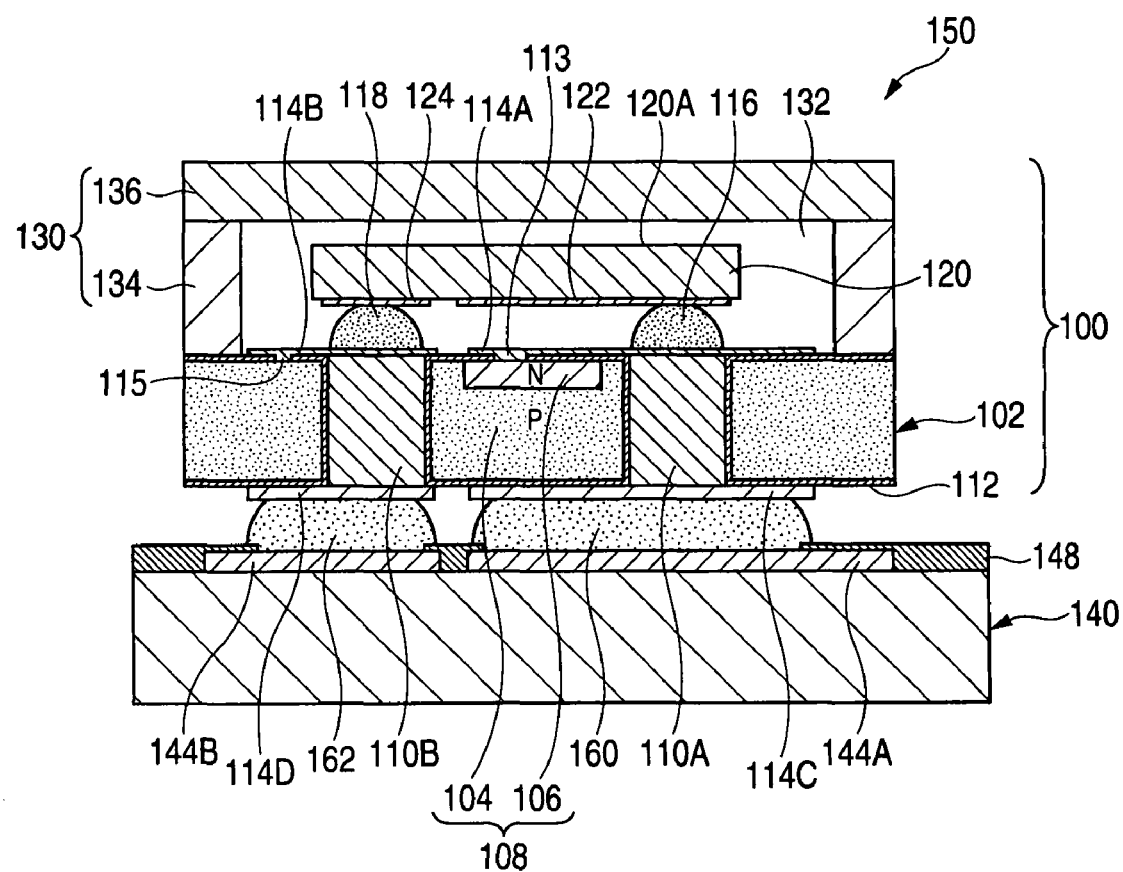
FIG. 3B is a longitudinal sectional view, taken along a ling IIB-IIB indicated in FIG. 2.

FIG. 2 is a plan view for indicating an embodiment 1 of a semiconductor device 100 according to the present invention. FIG. 3A is a longitudinal sectional view of the semiconductor device 100 taken along a line IIA-IIA shown in FIG. 2. FIG. 3B is another longitudinal sectional view of the semiconductor device 100, taken along another line IIB-IIB shown in FIG. 2. As shown in FIG. 2, FIG. 3A, and FIG. 3B, in the semiconductor device 100, a light emitting element (optical functional element) 120 constructed of an LED (light emitting diode), or the like, has been mounted on an upper plane of a semiconductor substrate 102. While the semiconductor substrate 102 has been formed by silicon (Si), a P layer 104 to which a P conductivity type impurity (for example, boron (B) etc.) has been added, and an N layer 106 have been formed in an impurity diffusion region of the semiconductor substrate 102. An N conductivity type impurity (for example, antimony, arsenic, phosphorous etc.) has been implanted to the P layer 104 and has been diffused so as to constitute the N layer 106. The semiconductor substrate 102 of the embodiment 1 is constructed in such a manner that the entire region is such an impurity diffusion region that a P type impurity has been previously diffused, and the N layer 106 is doped in a portion of this P layer 104. Then, a region where the N layer 106 is formed has been formed in the vicinity of a near center on the side of a mounting plane (namely, upper plane side shown in FIG. 3B) where the light emitting element 120 is mounted.

A zener diode 108 made of a semiconductor element has been formed by the above-described P layer 104 and N layer 106. It should be noted that in the embodiment 1, as a method of forming the zener diode 108, such a method is employed that an N type impurity is ionized by employing the below-mentioned ion implantation method so as to dope the ionized N type impurity into the impurity diffusion region of the semiconductor substrate 102.

Also, a plurality of penetration electrodes 110 have been formed in the semiconductor substrate 102, which are penetrated between an upper plane and a lower plane of the semiconductor substrate 102. The penetration electrodes 110 have been formed to contain a first penetration electrode 110A which is connected to a first electrode (+) 122 of the light emitting element 120, and a second penetration electrode 110B which is connected to a second electrode (−) 124 of the light emitting element 120. Also, in the embodiment 1, since the N layer 106 has been formed in the vicinity of a right-sided peripheral portion of such a region where the light emitting element 120 is mounted, the penetration electrode 110A can be located close to the penetration electrode 110B.

The first and second electrodes 122 and 124 of the light emitting element 120 have been set on bumps (for instance, Au bumps made of Au) 116 and 118 which are connected to wiring layers 114A and 114B formed on the semiconductor substrate 102, and the light emitting element 120 has been electrically connected via the bumps 116, 118, and the wiring layers 114A, 114B to the above-described penetration electrodes 110 (110A and 110B).

Also, lower edges of the penetration electrodes 110 (110A and 110B) have been connected to wiring layers 114C and 114D formed on the side of a lower plane of the semiconductor substrate 102, and these wiring layers 114C and 114D have been joined to solder bumps 160 and 162 on a mother board 140.

Furthermore, an oxide film (silicon oxide film) 112 functioning as an insulating layer has been formed on a surface of the semiconductor substrate 102. The surface of the semiconductor substrate 102 has been insulated, for instance, between this semiconductor substrate 102 and the penetration electrode 110, and between the wiring layers 114C and 114D by the above-explained oxide film 112. Also, wiring layers 114A and 114B made of, for instance, a Cu/Ni/Au plated layer have been formed on the upper plane side of the semiconductor substrate 102. The wiring layers 114A and 114B have been formed at such positions that these wiring layers 114A and 114B are electrically connected to upper edges of the penetration electrodes 110A and 110B. Also, one wiring layer 114A has been electrically connected to the N layer 106 via an N layer connecting portion 113 (circular portion indicated by broken line in FIG. 2) formed under a region where the light emitting element 120 is mounted. The other wiring layer 114B has been electrically connected to the P layer 104 via a P layer connecting portion 115 (circular portion shown by broken line in FIG. 2) formed on the outer side (position outside left-sided position in FIG. 2 and FIG. 3A) of the region where the light emitting element 120 is mounted.

Figure 4A:
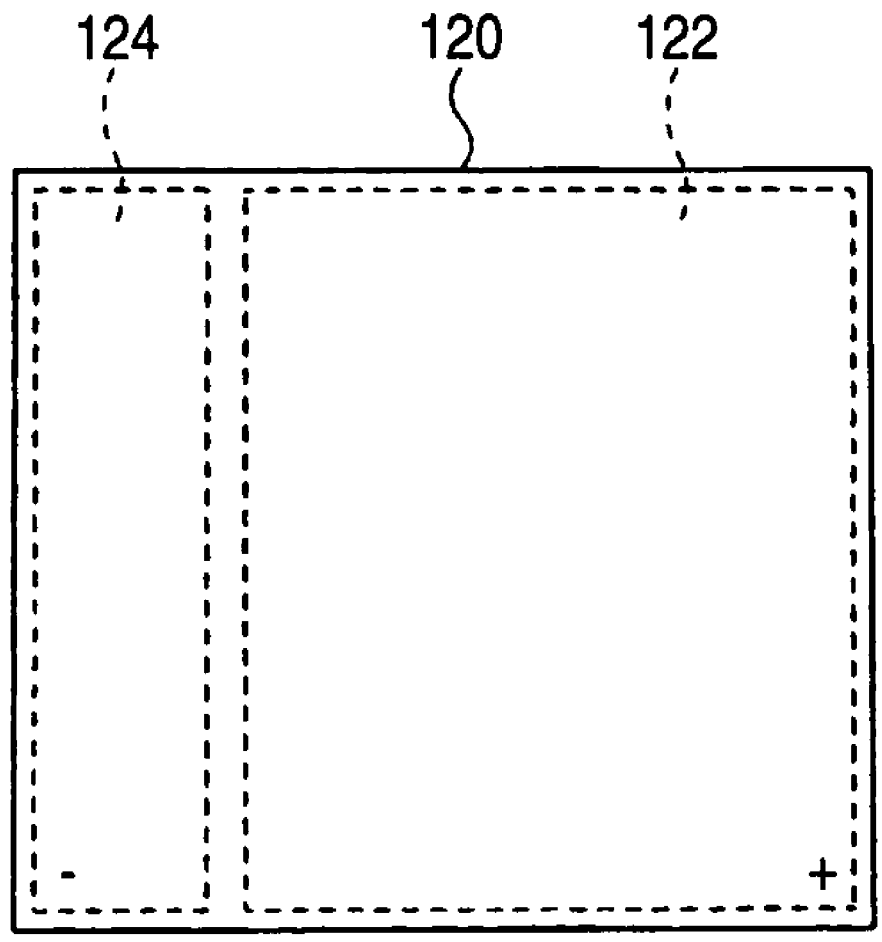
FIG. 4A is a plan view for showing an electrode pattern of a light emitting element 120.

As indicated by a broken line in FIG. 4A, in the light emitting element 120, the first electrode (+) 122 and the second electrode (−) 124 have been formed in a rectangular shape on the lower plane thereof. A light emitting diode (LED) manufactured by a semiconductor in an inner portion of the light emitting element 120 has been formed between these first and second electrodes 122 and 124.

The electrodes 122 and 124 of the light emitting element 120 have been connected via the bumps 116 and 118, and also the wiring layers 114A and 114B to the penetration electrodes 110A and 110B. Furthermore, the P layer 104 and the N layer 106 have been connected via the wiring layers 114A and 114B with respect to the zener diode 108 in a parallel manner (refer to FIG. 4C which will be described later).

Figure 4B:
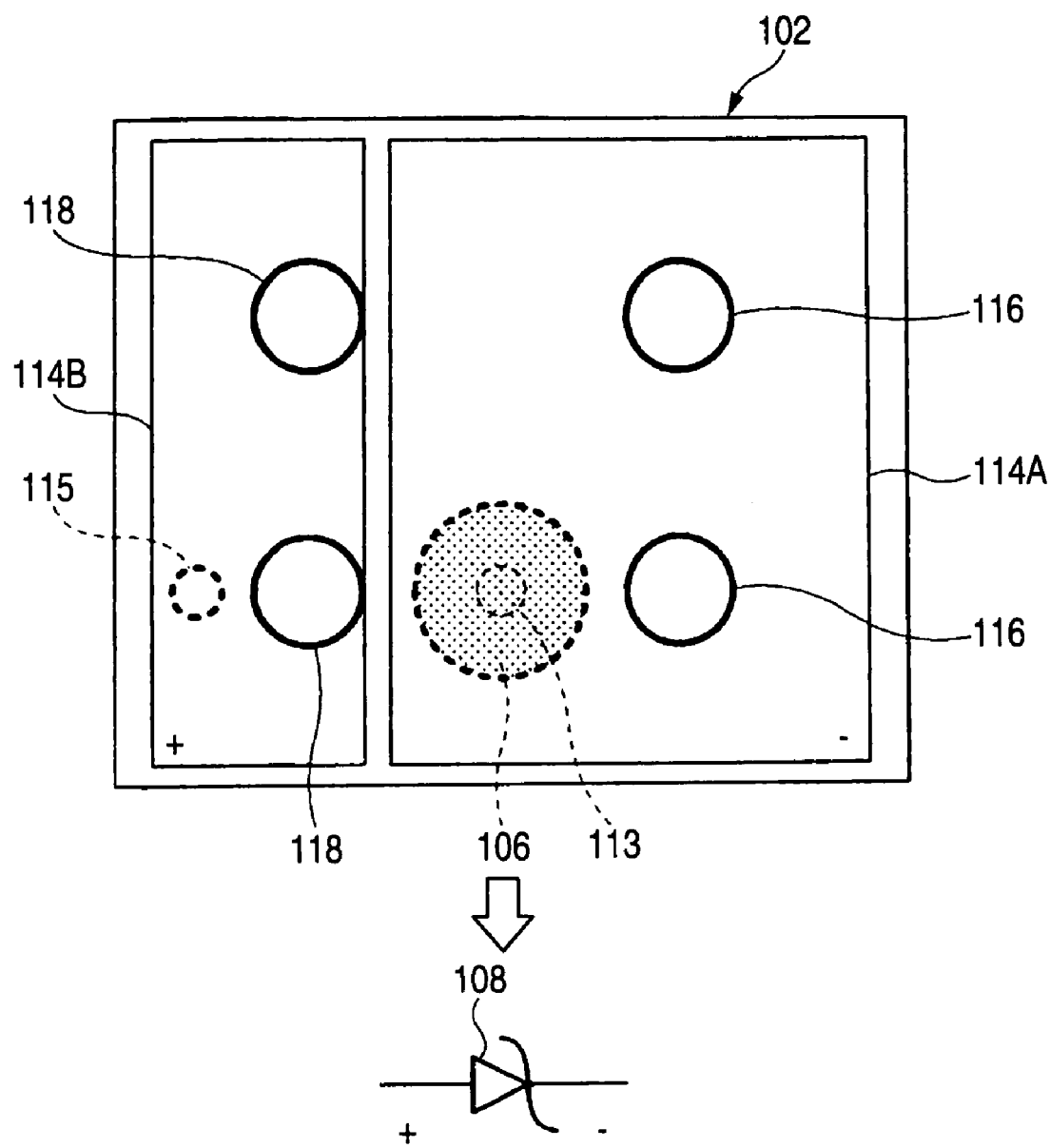
FIG. 4B is a plan view for representing a positional relationship among respective connecting portions, an N layer, and wiring layers of a semiconductor element 102.

As represented by a broken line, in FIG. 4B, on the semiconductor substrate 102, the N layer connecting portion 113 and the N layer 106 have been formed in such a manner that the N layer connecting portion 113 and the N layer 106 are located between the bumps 116 and 118 (between penetration electrodes 110A and 110B). Also, as indicated by a broken line, in FIG. 4B, a P layer connecting portion 115 which connects the P layer 104 to the wiring layer 114B has been formed on the side portion of the bump 118 (penetration electrode 110B) on the semiconductor substrate 102. As a consequence, in the semiconductor substrate 102, the zener diode 108 made of the semiconductor has been formed between the N layer connecting portion 113 and the P layer connecting portion 115, while the characteristic of the zener diode 108 is set based upon a distance between the N layer connecting portion 113 and the P layer connecting portion 115, and a distance between the penetration electrodes 110A and 110B.

Figure 4C:
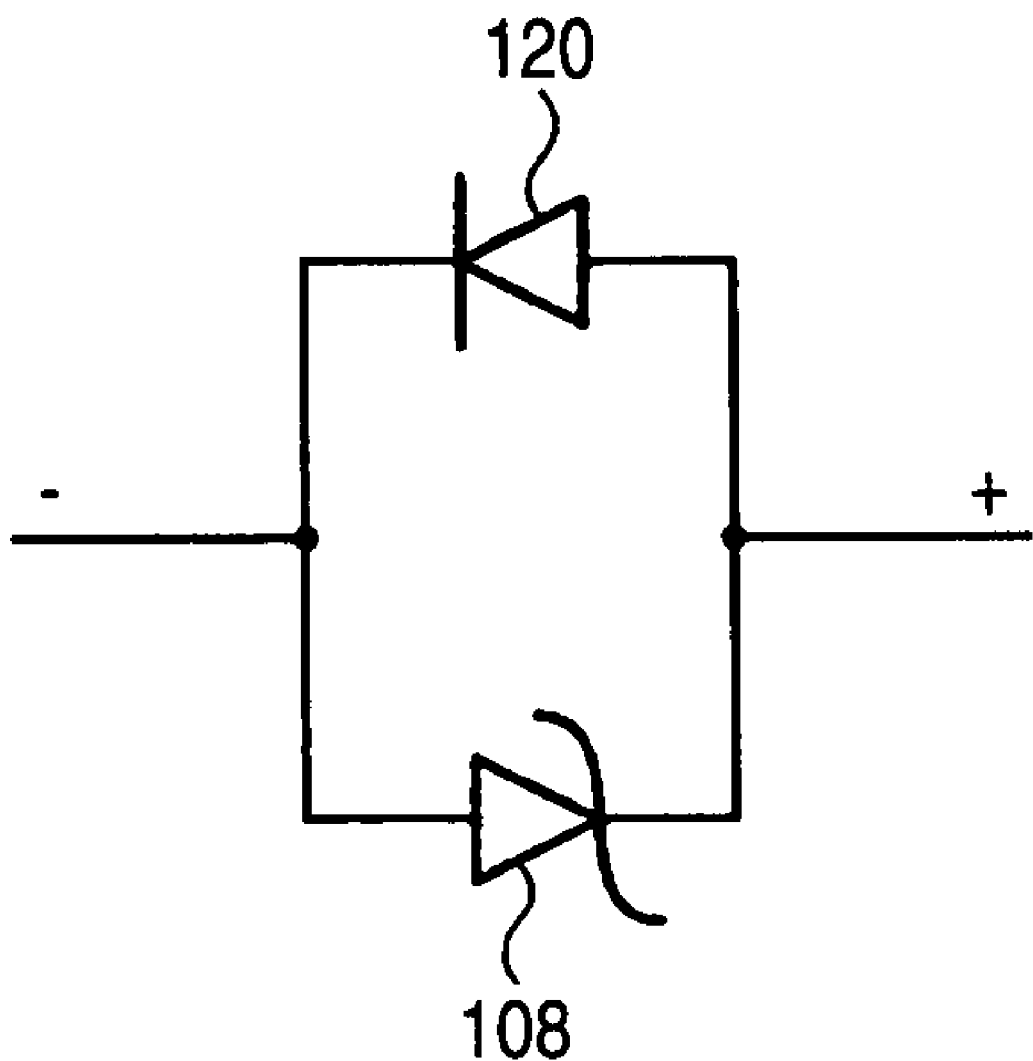
FIG. 4C is a diagram for representing a connection relationship between a zener diode 108 and the light emitting element 120.

When a connection relationship between this zener diode 108 and the light emitting element 120 is expressed by an equivalent circuit, this equivalent circuit may be expressed as such a circuit arrangement as shown in FIG. 4C. The zener diode 108 has a characteristic that in an electron avalanche breakdown region, a reverse current is rapidly increased within a range where the reverse current is limited. As a consequence, the first electrode 122 and the second electrode 124 of the light emitting element 120 are connected to a plus-sided terminal and a minus-sided terminal of a power supply, and further, the N layer connecting portion 113 and the P layer connecting portion 115 of the zener diode 108 are connected to the plus-sided terminal and the minus-sided terminal of the power supply, so that a voltage may be stabilized by the zener diode 108 parallel-connected with respect to the light emitting element 120, for instance, it is possible to avoid that a high voltage caused by electrostatic energy, and the like is applied to the light emitting element 120.

Figure 4D:
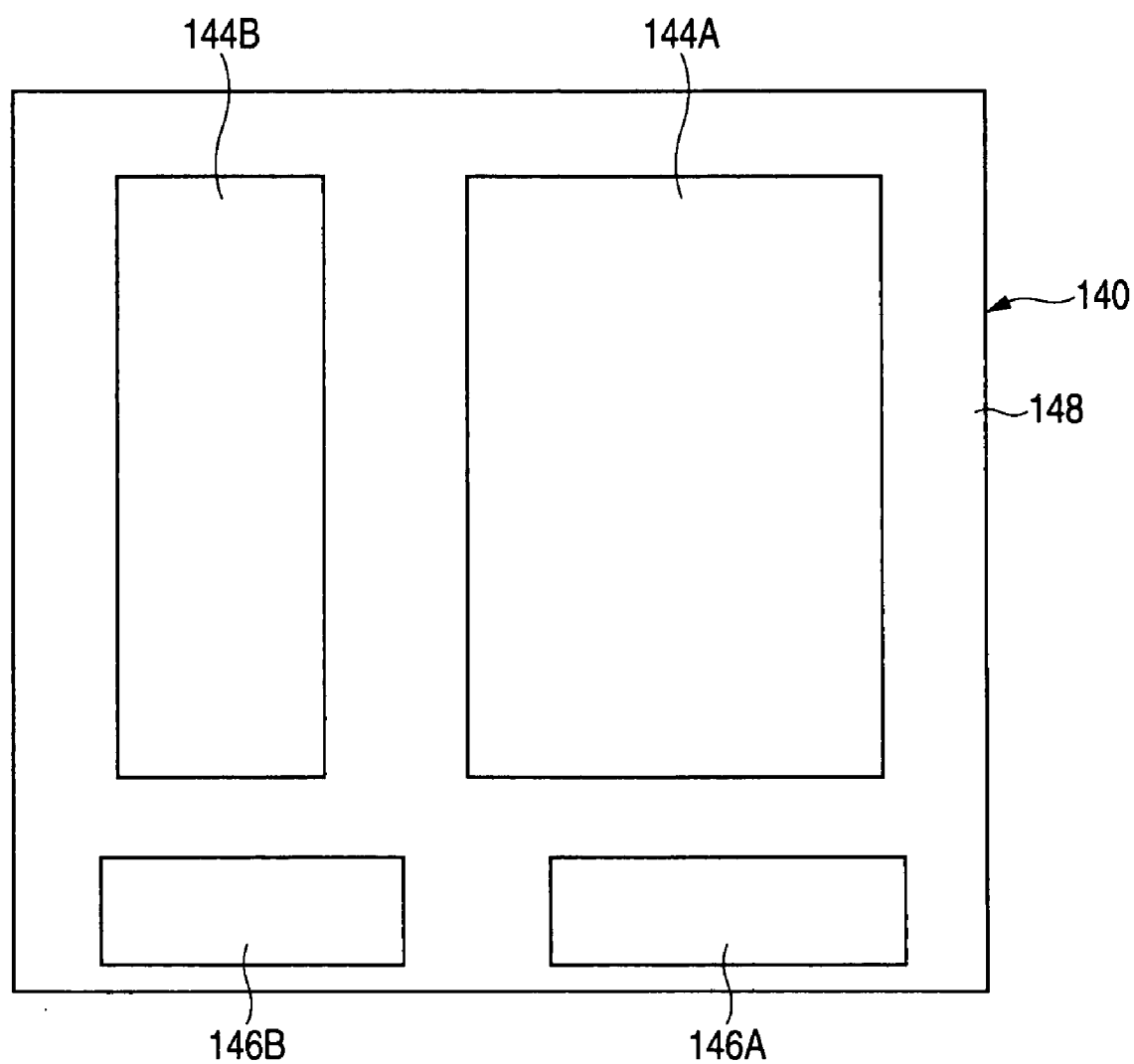
FIG. 4D is a plan view for showing a mother board 140.

As indicated in FIG. 4D, connection terminals 144A and 144B have been formed on mounted regions where the semiconductor device 100 is mounted, and external connection terminals 146A and 146B which are connected to an external power supply (not shown) have been formed on portions located adjacent to the mounting regions on the mother board 140. While the external connection terminals 146A and 146B have been connected to the connection terminals 144A and 144B, a position which is exposed by a pattern of an insulating layer 148 formed on the upper plane of the mother board 140 is set to an arbitrary position.

As shown in FIG. 3A and FIG. 3B, wiring layers 114C and 114D have been formed on the side (lower plane side) opposite to the side of the semiconductor substrate 102 to which the light emitting element 120 is connected, and furthermore, solder bumps 160 and 162 have been formed on the wiring layers 114C and 114D. It should be understood that as the wiring layers 114A and 114B, an Ni layer and an Au layer have been stacked on a Cu layer in such a manner that the Au layer is formed on the upper plane side to which the bumps 116 and 118 are joined.

In accordance with the semiconductor device 100 with employment of the above-described structure, the zener diode 108 made of the semiconductor, which has been formed in the impurity diffusion region of the semiconductor substrate 102, is electrically connected to the light emitting element 120. As a result, the semiconductor device 100 can be largely made compact, and can be furthermore manufactured in the largely reduced installation space, as compared with the conventional semiconductor device constructed by mounting the zener diode on the substrate.

Also, the light emitting element 120 is sealed by the sealing structural member 130 joined to the upper plane of the semiconductor substrate 102. The sealing structural member 130 is constituted by a frame portion 134 having a rectangular frame shape and a transparent glass plate 136 having an optical transmission plane. The transparent glass plate 136 is joined to the frame portion 134 in such a manner that an upper opening of the frame portion 134 is tightly closed by this transparent glass plate 136. Thus, the sealing structural member 130 has such a sealing structure which stores the light emitting element 120 into an internal space 132 which is tightly closed between the semiconductor substrate 102 and the own sealing structural member 130.

As will be described later, in the embodiment 1, since such a structural member has been previously formed under such a condition that the frame portion 134 is joined to the glass plate 136, the sealing structural member 130 is joined to the upper plane of the semiconductor substrate 102. Also, in the case where the frame portion 134 has been formed by a glass member, the inner portion of the sealing structural member 130 is formed by glass in an integral manner, so that the lower plane of the frame portion 134 may be anode-joined with respect to the upper plane of the semiconductor substrate 102.

Alternatively, as another method for forming the sealing structural member 130, a metal material such as Cu may be stacked on the oxide film 112 in a rectangular frame shape by employed, for example, a plating method so as to form the frame portion 134, while the oxide film 112 has been formed on the upper plane of the semiconductor substrate 102. Then, the frame portion 134 may be joined to the glass plate 136 under such a condition that the glass plate 136 having the plane shape is overlapped with the upper plane of the frame portion 134.

The sealing structural member 130 can seal the above-described space 132 under air tight condition since the lower plane of the glass frame 134 is strongly joined by the anode joining with respect to the substrate 102 made of silicon. As a consequence, while the light emitting element 120 may be protected by the sealing structural member 130 in such a manner that dust and the like are not attached to a light emitting plane 120A, light emitted from the light emitting plane 120A passes through the glass plate 136 and then is projected upwardly.

The above-described semiconductor device 100 is mounted on the mother board 140, so that a mounted structure 150 is arranged. The connection terminals 144A and 144B have been formed on the mounted regions where the semiconductor device 100 is mounted, and the external connection terminals 146A and 146B which are connected to the external power supply (not shown) have been formed on portions located adjacent to the mounting regions on the mother board 140. The external connection terminals 146A and 146B have been formed on the portion located adjacent to the mounted region. Also, an insulating layer 148 has been formed at peripheral portions of the connection terminals 144A and 144B, and of the external connection terminals 146A and 146B. Also, while the external connection terminals 146A and 146B have been connected to the connection terminals 144A and 144B, the semiconductor device 100 is mounted via the solder bumps 160 and 162 to the connection terminals 144A and 144B.

Figure 5A:
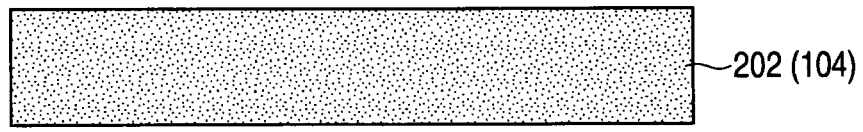
FIG. 5A is a diagram for explaining a step (No. 1) of a manufacturing method of the embodiment 1.
Figure 5B:
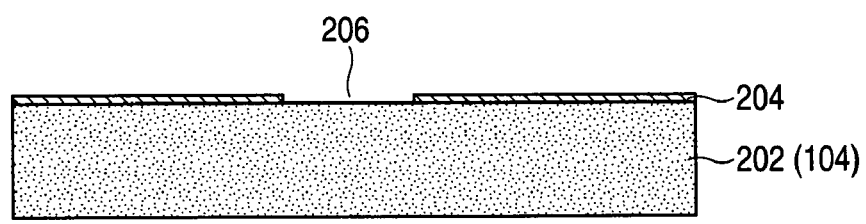
FIG. 5B is a diagram for explaining a step (No. 2) of the manufacturing method of the embodiment 1.
Figure 5C:
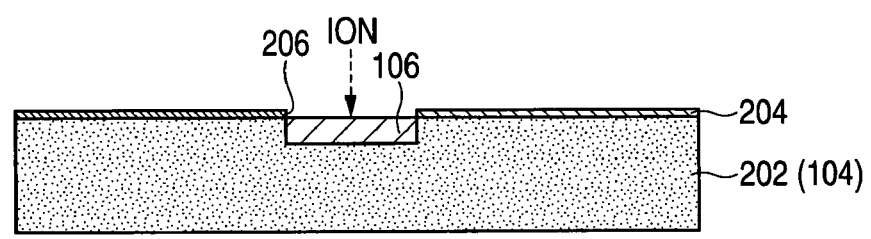
FIG. 5C is a diagram for explaining a step (No. 3) of the manufacturing method of the embodiment 1.
Figure 5D:
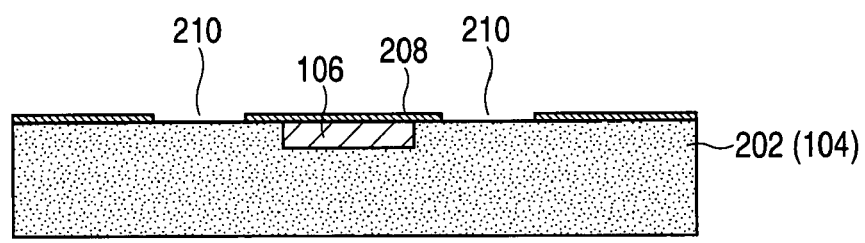
FIG. 5D is a diagram for explaining a step (No. 4) of the manufacturing method of the embodiment 1.
Figure 5E:
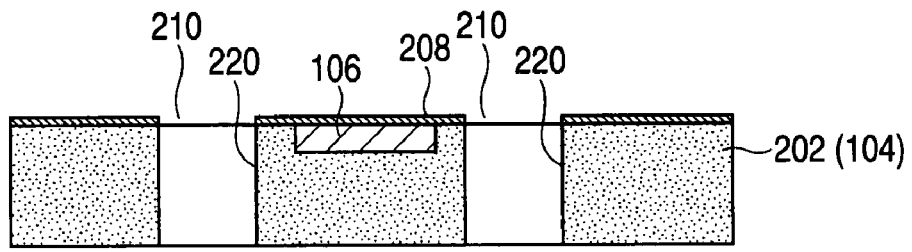
FIG. 5E is a diagram for explaining a step (No. 5) of the manufacturing method of the embodiment 1.
Figure 5F:
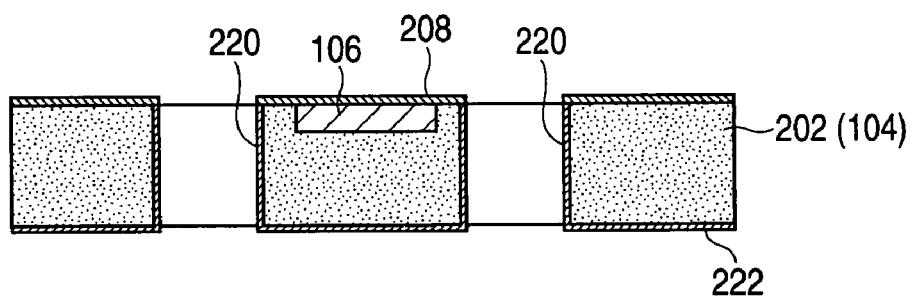
FIG. 5F is a diagram for explaining a step (No. 6) of the manufacturing method of the embodiment 1.
Figure 5G:
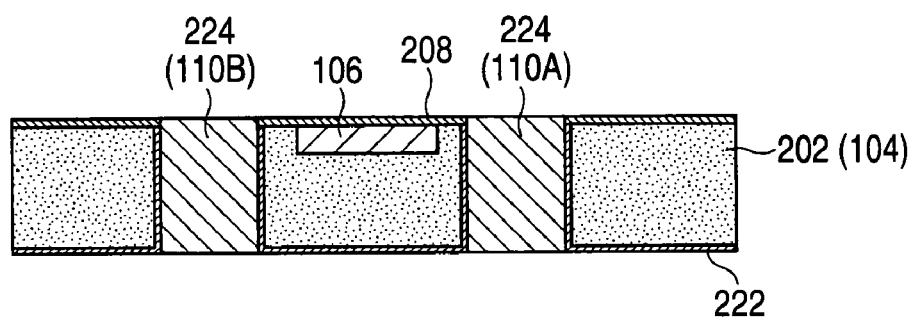
FIG. 5G is a diagram for explaining a step (No. 7) of the manufacturing method of the embodiment 1.
Figure 5H:
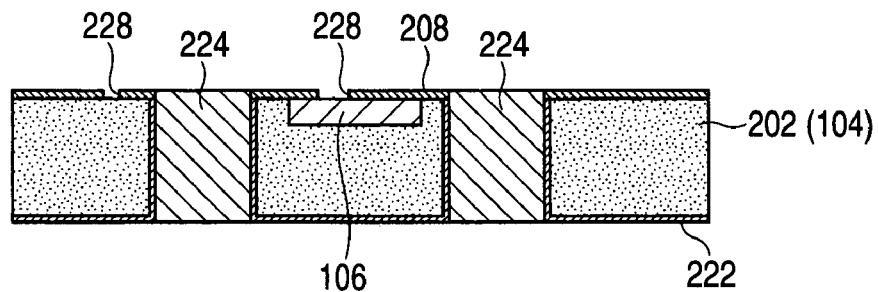
FIG. 5H is a diagram for explaining a step (No. 8) of the manufacturing method of the embodiment 1.
Figure 5I:
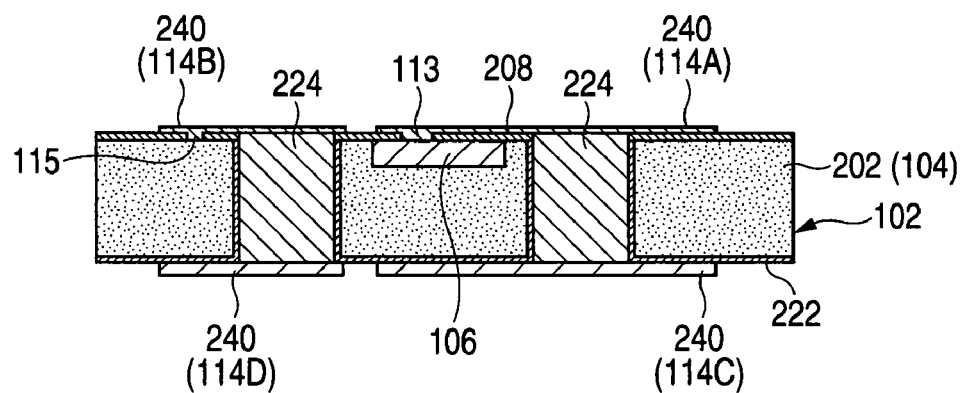
FIG. 5I is a diagram for explaining a step (No. 9) of the manufacturing method of the embodiment 1.
Figure 5J:
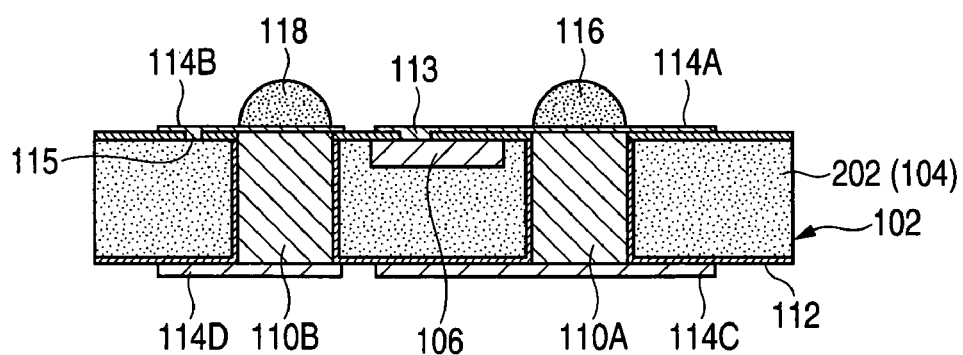
FIG. 5J is a diagram for explaining a step (No. 10) of the manufacturing method of the embodiment 1.
Figure 5K:
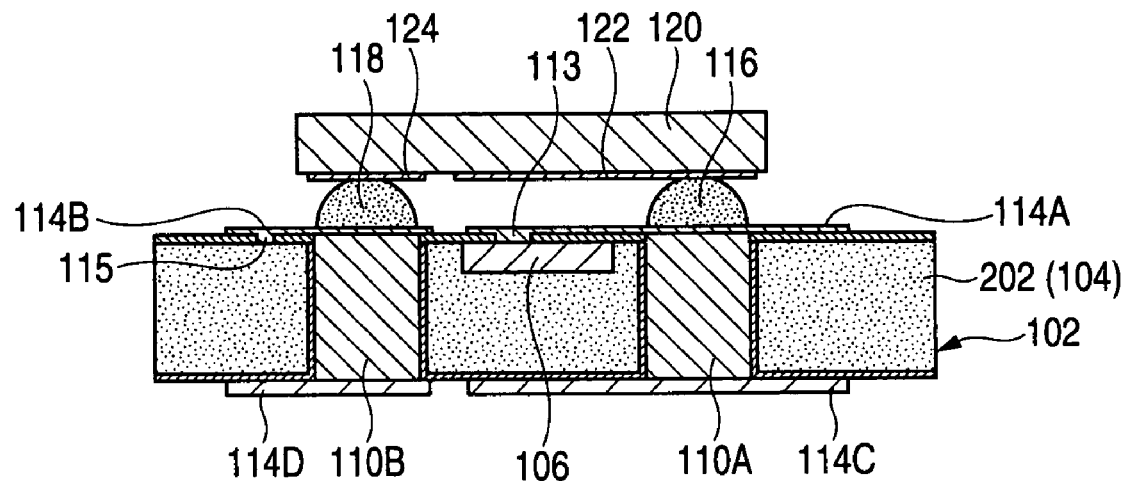
FIG. 5K is a diagram for explaining a step (No. 11) of the manufacturing method of the embodiment 1.
Figure 5L:
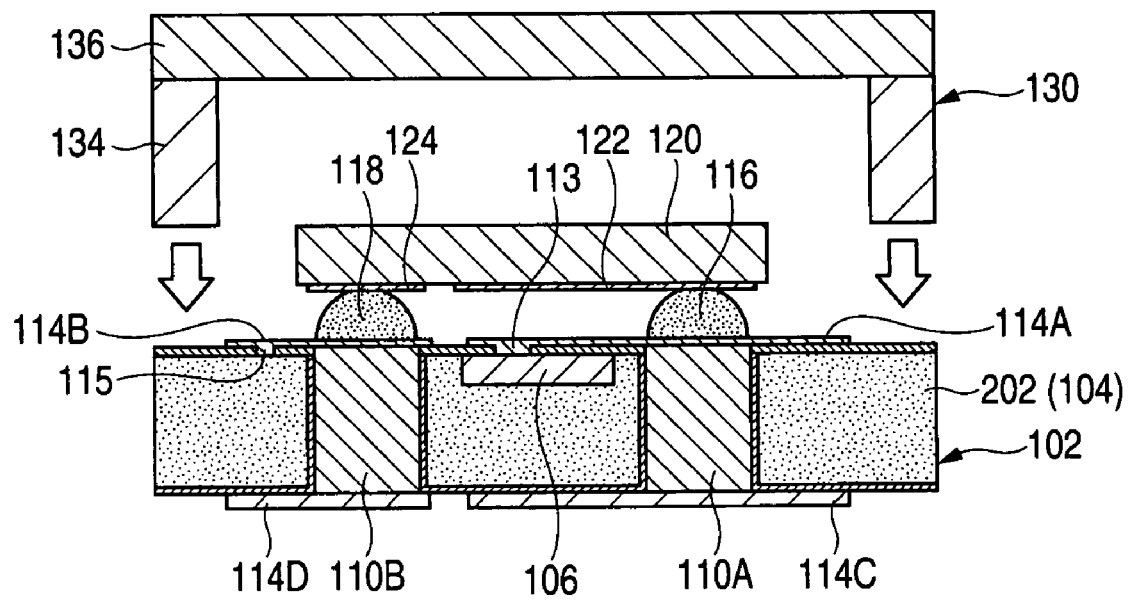
FIG. 5L is a diagram for explaining a step (No. 12) of the manufacturing method of the embodiment 1.
Figure 5M:
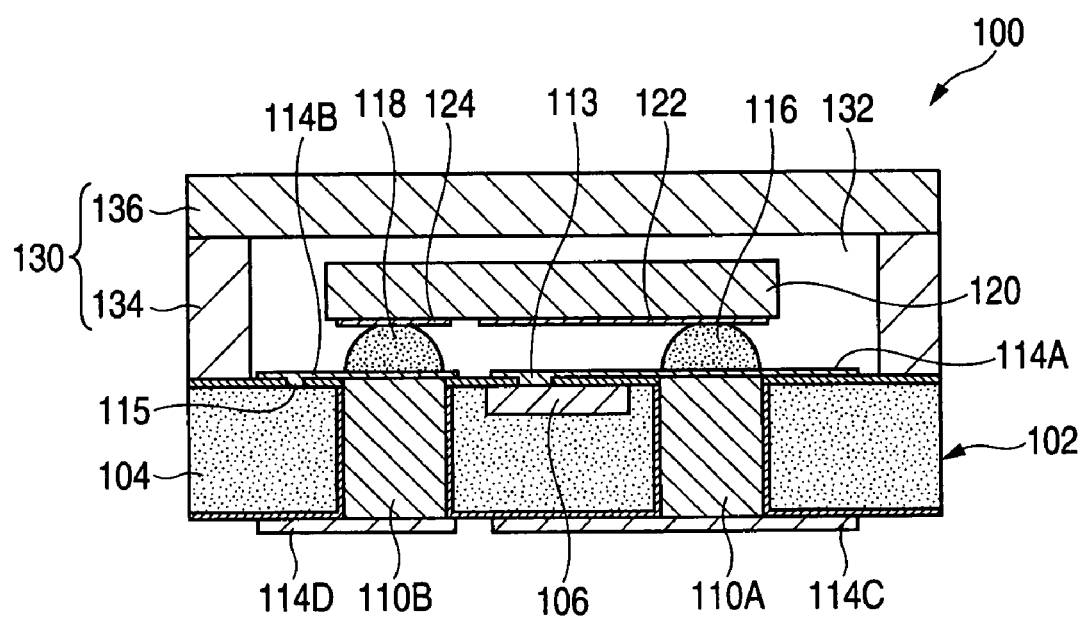
FIG. 5M is a diagram for explaining a step (No. 13) of the manufacturing method of the embodiment 1.
Figure 5N:
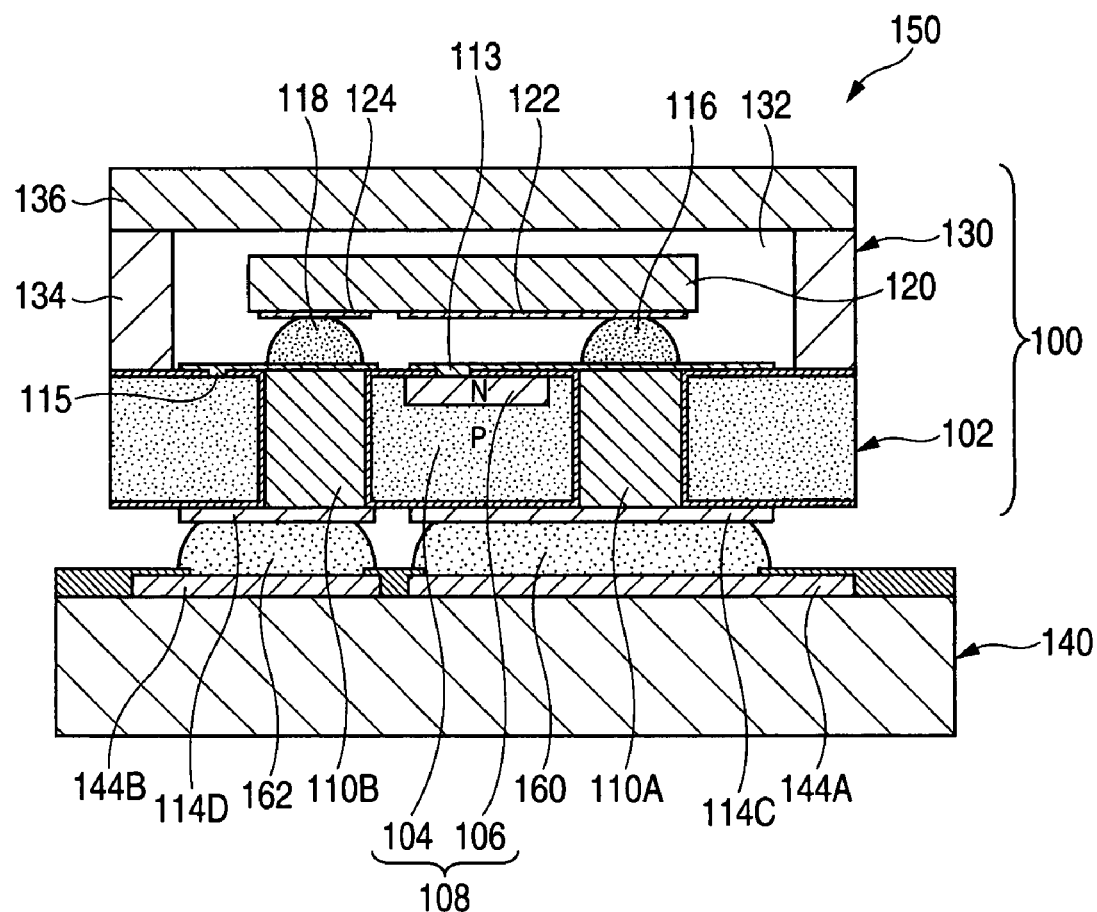
FIG. 5N is a diagram for explaining a step (No. 14) of the manufacturing method of the embodiment 1.

Referring now to FIG. 5A to FIG. 5N, a description is made of respective steps of a method for manufacturing the above-described semiconductor device 100 and mounted structure 150.

In a step (No. 1) shown in FIG. 5A, a silicon substrate 202 (thickness thereof is, for example 750 μm) corresponding to the semiconductor substrate 102 is prepared. An internal portion of this silicon substrate 202 has become an impurity diffusion region (corresponding to P layer 104) where a P type impurity has been added to the entire portion thereof.

In a step (No. 2) indicated in FIG. 5B, an ion implantation-purpose resist film 204 is formed on an upper plane of the silicon substrate 202, and furthermore, a surface of the ion implantation-purpose resist film 204 is patterned so as to form an ion implantation-purpose opening 206 at an ion implantation position of the ion implantation-purpose resist film 204.

In a step (No. 3) shown in FIG. 5C, ions accelerated by a high electric field by ionizing N type impurity gas by operating an ion implantation apparatus (not shown) are implanted (doped) from the opening 206 on the surface of the silicon substrate 202, and this ion doped portion is diffused to form the N layer 106.

In a step (No. 4) shown in FIG. 5D, after the ion implantation-purpose resist film 204 is removed, a nitride film 208 is formed on the upper plane of the silicon substrate 202. The nitride film 208 is formed as a protection film capable of preventing contaminations and oxidizations of the ion-doped N layer 106. Furthermore, a patterning process operation is carried out with respect to the above-explained nitride film 208 so as to form an opening 210 used to form the penetration electrodes 110.

In a step (No. 5) shown in FIG. 5E, holes 220 for the penetration electrodes 110 are formed under the opening 210 by performing a dry etching process operation. The holes 220 are formed in a depth (for example, depth of 200 μm) which is shallower than the thickness of the silicon substrate 202. Thereafter, the lower plane of the silicon substrate 202 is deleted so as to be made thinner by a back grinder process operation. Then, the back grinder process operation is carried out until lower edges of the holes 220 are exposed to the lower plane side, and further, the thickness of the silicon substrate 202 becomes equal to the thickness of the semiconductor substrate 102.

In a step (No. 6) indicated in FIG. 5F, an insulating film 222 (corresponds to oxide film 112 shown in FIG. 3A and FIG. 3B) such as $SiO_2$ (for instance, thickness of 50 angstrom) is formed on the lower plane of the silicon substrate 202 and inner planes of the holes 220 by a thermal oxidization. Then, a power supply layer (not shown) is formed on at least inner portions of the holes 220 by a plating method.

In a step (No. 7) indicated in FIG. 5G, Cu plating layers 224 are deposited on the inner portions of the holes 220 by an electrolytic plating method by supplying electric power from the power supply layer, and then, the deposited Cu plating layer 224 is grown, so that the penetration electrodes 110 are formed in the holes 220. In this case, a resist (not shown) is provided in such a manner that only the holes 220 are exposed. It should also be noted that the plating resist is removed after the plating operation has been carried out.

In a step (No. 8) shown in FIG. 5H, openings 228 (correspond to portions where connecting portions 113 and 115 are formed) are formed in both an ion implantation position (position of N layer 106) of the nitride film 208, and a position (namely, upper plane of left-sided edge portion of FIG. 5H) outside the mounted region where the light emitting element 120 is mounted by executing, for example, a dry etching treatment.

In a step (No. 9) shown in FIG. 5I, conducting layers (corresponding to wiring layers 114A to 114D) such as Cu are formed on the upper plane and the lower plane of the silicon substrate 202 by performing a plating method, or the like. It should also be noted that as a concrete forming method of the conducting layers 240, for instance, both edge portions of the nitride film 208 and the penetration electrodes 110 are exposed to the upper plane side. Then, a Ti layer and a Cu layer are stacked on the upper planes of the edge portions of the nitride film 208 and the penetration electrodes 110 by a sputtering method so as to form a power supply layer (thickness thereof is, for example, 500 angstrom). This power supply layer also has an effect capable of increasing a closely contacting characteristic between the N type 106 and the P type 104, since the Ti layer is formed which may be readily coupled to the silicon substrate 202. Then, such regions within the surface of the power supply layer except for the wiring layers 114A to 114D are masked by a plating resist, and conductive metals (Cu, Ni, Au etc.) are stacked (in thickness of, for instance, 5 μm) by performing an electrolytic plating method by supplying electric power from the power supply layer, so that a conducting layer 240 having a predetermined pattern shape is formed. Thereafter, the plating resist of the regions except for the conducting layer 240, and the power supply layer are removed. As a result, the above-described semiconductor substrate 102 shown in FIG. 3A and FIG. 3B is accomplished.

In a step (No. 10) indicated in FIG. 5J, bumps 116 and 118 such as Au bumps are formed on the conducing layers 240 (wiring layers 114A and 114B) on the upper plane side of the silicon substrate 202.

In a step (No. 11) shown in FIG. 5K, the electrodes 122 and 124 of the light emitting element 120 abut against the bumps 116 and 118 on the silicon substrate 202 so as to be joined to these bumps 116 and 118 by using ultrasonic waves. Although not shown in the drawings, a plurality of element mounting portions have been formed on the silicon substrate 202; plural pieces of the light emitting elements 120 have been mounted thereon for each of predetermined intervals; and after the light emitting elements 120 are mounted, the silicon substrate 202 is individually diced from each other in a dicing step, so that the individual semiconductor elements 100 are obtained. Alternatively, the dicing step may be carried out under such a condition that the semiconductor devices 100 where the light emitting elements 120 have been mounted on the semiconductor substrate 102 are diced, or as will be discussed later, after the semiconductor devices 100 are sealed by the below-mentioned sealing structural member 130, the resulting semiconductor devices 100 are diced.

In a step (No. 12) shown in FIG. 5L, the sealing structural member 130 in which the frame portion 134 (made of glass) and the glass plate 136 corresponding to the optical transmitting portion have been formed in an integral body is positioned to a peripheral portion of the semiconductor substrate 102 in such a manner that the frame portion 134 is mounted.

In a step (No. 13) shown in FIG. 5M, the sealing structural member 130 having the optical transmitting characteristic and made of the glass is joined to the silicon substrate 202 by an anode joining method so as to seal the light emitting element 120 on the semiconductor substrate 102. The anode joining method is performed in such a manner that a high voltage is applied between the silicon substrate 202 and the glass (frame portion 134), and temperatures of the silicon substrate 202 and the glass are increased to, for instance, approximately 300 to 350° C. As the glass which forms the sealing structural member 130, since boron silicic acid glass has been employed into which boron having a heat resistance characteristic, the sealing structural member 130 may be joined to the silicon substrate 202 under better condition by the anode joining method.

As previously described, the semiconductor device 100 shown in FIG. 2, FIG. 3A, and FIG. 3B can be manufactured in a higher efficiency. As a consequence, the semiconductor device 100 capable of being largely made compact and of largely reducing the installation space thereof can be accomplished, as compared with the conventional semiconductor device in which the zener diode is mounted on the substrate.

In a step (No. 14) shown in FIG. 5N, under such a condition that the wiring layers 114C and 114D formed on the lower plane side of the silicon substrate 202 abut against the solder bumps 160 and 162, these solder bumps 160 and 162 are heated so as to be melted, so that the wiring layers 114C and 114D are joined to the melted solder bumps 160 and 162. As a consequence, the semiconductor device 100 is mounted on the mother board 140, so that the mounted structure 150 shown in FIG. 2, FIG. 3A, and FIG. 3B may be accomplished.

As previously explained, in accordance with the manufacturing method constructed of the above-described respective steps shown in FIG. 5A to FIG. 5N, the semiconductor device 100 can be manufactured in which the zener diode 108 made of the semiconductor and formed in the impurity diffusion region of the semiconductor substrate 102 is electrically connected to the light emitting element 120, and furthermore, the mounted structure 150 can be manufactured in a higher efficiency, in which the above-described semiconductor device 100 is mounted on the mother board 140.

[Embodiment 2]

Figure 6A:
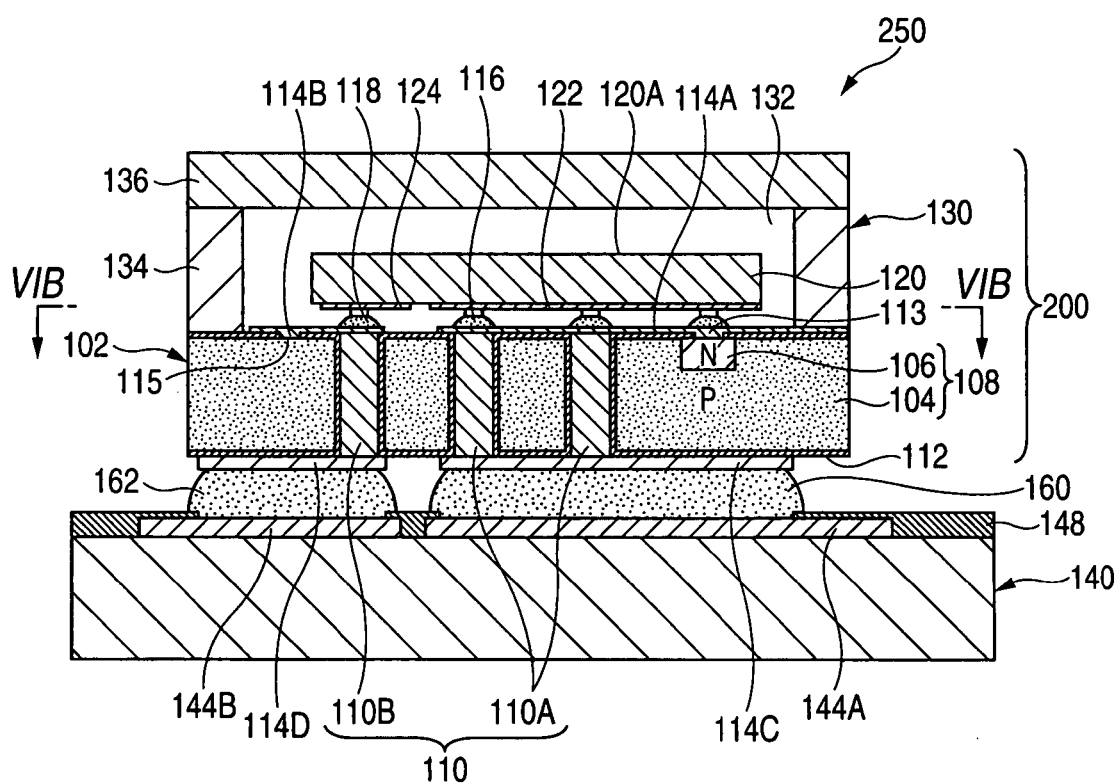
FIG. 6A is a longitudinal sectional view for showing an embodiment 2 of a semiconductor device according to the present invention.
Figure 6B:
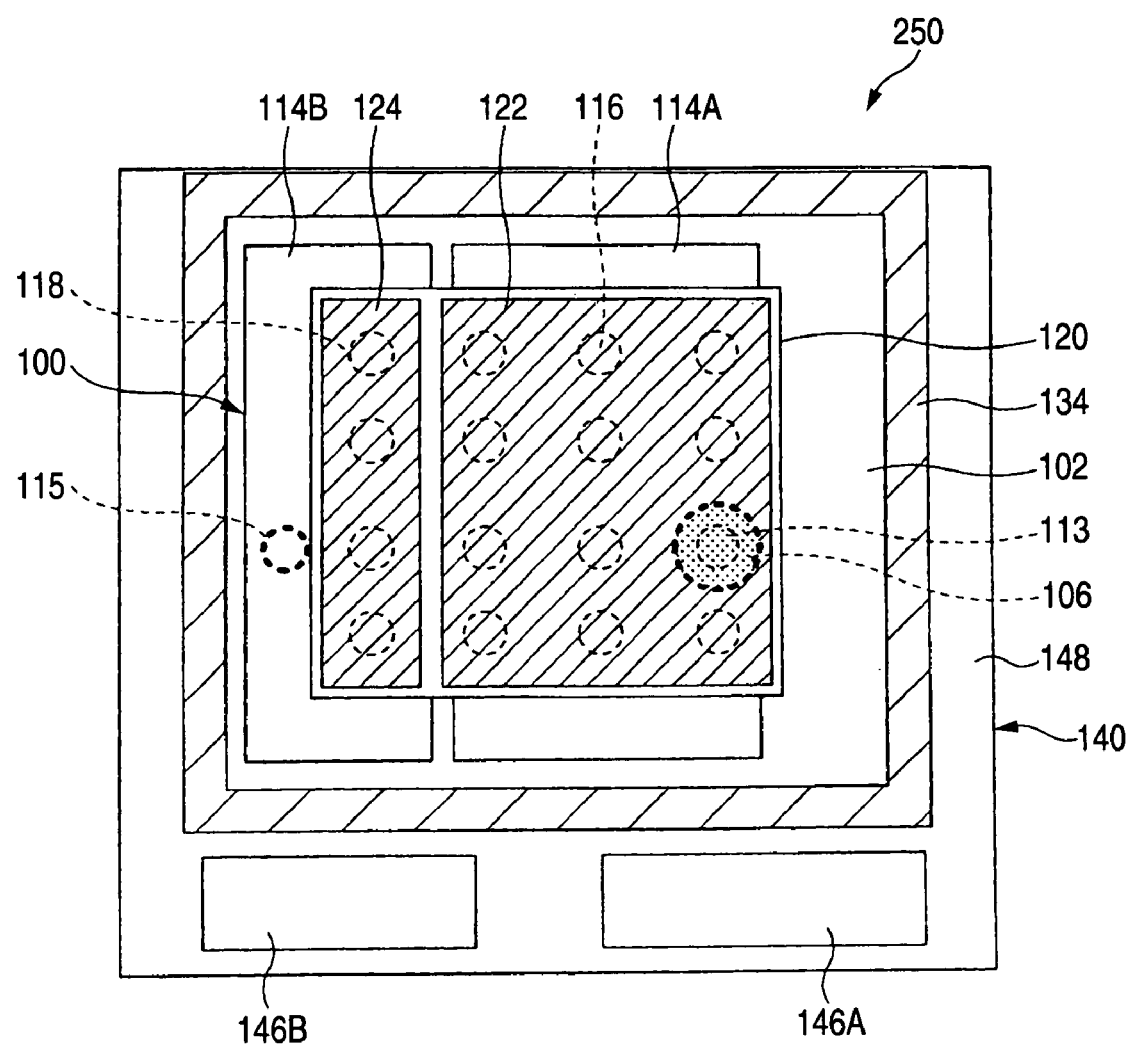
FIG. 6B is a lateral sectional view for indicating the semiconductor device, taken along a line VIB-VIB indicated in FIG. 6A.

FIG. 6A is a longitudinal sectional view for representing an embodiment 2 of a semiconductor device 200 according to the present invention. FIG. 6B is a lateral sectional view of the semiconductor device 200, taken along a line VIB-VIB shown in FIG. 6A. It should be understood that in FIG. 6A and FIG. 6B, the same reference numerals of the above-described embodiment 1 will be employed as those for denoting the same structural elements, and descriptions thereof are omitted.

As shown in FIG. 6A, and FIG. 6B, in the semiconductor device 200, a light emitting element 120 constructed of an LED (light emitting diode), or the like, has been mounted on an upper plane of a semiconductor substrate 102. In the semiconductor substrate 102, a P layer 104 to which a P conductivity type impurity has been added, and an N layer 106 have been formed, while an N conductivity type impurity has been implanted to the P layer 104 and has been diffused so as to constitute the N layer 106. The N layer 106 has been formed in the vicinity of a right-sided edge portion on the side of a mounted plane (namely, upper plane side shown in FIG. 6B) where the light emitting element 120 is mounted.

A zener diode 108 made of a semiconductor element has been formed by the above-described P layer 104 and N layer 106. It should be noted that also in the embodiment 2, such a method is employed that an N type impurity is ionized by employing the above-mentioned ion implantation method so as to dope the ionized N type impurity into the impurity diffusion region of the semiconductor substrate 102.

Also, a plurality of penetration electrodes 110 penetrated between an upper plane and a lower plane of the semiconductor substrate 102 have been formed to contain a first penetration electrode 110A which is connected to a first electrode (+) 122 of the light emitting element 120, and a second penetration electrode 110B which is connected to a second electrode (−) 124 of the light emitting element 120. Also, in the embodiment 2, since the N layer 106 has been formed in the vicinity of a right-sided peripheral portion of such a region where the light emitting element 120 is mounted, the penetration electrode 110A can be located close to the penetration electrode 110B, and thus, a characteristic of a zener diode 108 is set based upon such a resistance defined in response to a distance between connecting portions 113 and 115, and another distance between the penetration electrode 110A and the penetration electrode 10B.

Also, the penetration electrodes 110A have been formed at two positions, namely, a position located close to the second penetration electrode 110B, and another position separate from this second penetration electrode 110B. As a result, connections between the electrode 122 of the light emitting element 120 and the connection terminal 144A of the mother board 140 can be performed at two portions, so that the electric connections can be firmly carried out.

Also, wiring layers 114A and 114B formed on the side of an upper plane of the semiconductor 102 have been formed at such positions that these wiring layers 114A and 114B are electrically connected to upper edges of the penetration electrodes 110A and 110B. Also, one wiring layer 114A has been electrically connected to the N layer 106 via an N layer connecting portion 113 formed in the vicinity of a right-sided edge portion of a region where the light emitting element 120 is mounted. The other wiring layer 114B has been electrically connected to the P layer 104 via a P layer connecting portion 115 formed on the outer side (position outside left-sided position in FIG. 6A) of the region where the light emitting element 120 is mounted.

The electrodes 122 and 124 of the light emitting element 120 have been connected via the wiring layers 114A and 114B to the penetration electrodes 110A and 110B. Furthermore, the P layer 104 and the N layer 106 have been connected via the wiring layers 114A and 114B with respect to the light emitting element 120. When a connection relationship between this zener diode 108 and the light emitting element 120 is expressed by an equivalent circuit, this equivalent circuit maybe expressed as such a circuit arrangement as shown in FIG. 4C.

As a consequence, similar to the above-described embodiment 1, the electrodes 122 and 124 of the light emitting element 120 are connected to the plus-sided terminal and the minus-sided terminal of the power supply, so that a voltage may be stabilized by the zener diode 108 parallel-connected with respect to the light emitting element 120, for instance, it is possible to avoid that a high voltage caused by electrostatic energy, and the like is applied to the light emitting element 120.

The first and second electrodes 122 and 124 of the light emitting element 120 have been set on bumps (for instance, bumps made of Au) 116 and 118 which are connected to wiring layers 114A and 114B, and the light emitting element 120 has been electrically connected via the bumps 116, 118, and the wiring layers 114A, 114B to the above-described penetration electrodes 110 (110A and 110B).

Also, lower edges of the penetration electrodes 110A and 110B have been connected to wiring layers 114C and 114D formed on the opposite side (lower plane side) of the semiconductor substrate 102, and furthermore, these wiring layers 114C and 114D have been connected via solder bumps 160 and 162 to connection terminals 144A and 144B of a mother board 140.

In the mounted structure 250 in which the semiconductor device 200 is mounted on the mother board 140, the P layer 104 and the N layer 106, which form the zener diode 108, have been connected to the connection terminals 144A and 144B of the mother mode 140 in such a manner that the P layer 104 and the N layer 106 are provided parallel to the light emitting element 120. In accordance with the semiconductor device 200, since the zener diode 108 made of the semiconductor and formed in the semiconductor substrate 102 is electrically connected to the light emitting element 120, the semiconductor device 200 can be largely made compact, and can be furthermore manufactured in the largely reduced installation space, as compared with the conventional semiconductor device constructed by mounting the zener diode on the substrate.

Also, the light emitting element 120 is sealed by the sealing structural member 130 joined to the upper plane of the semiconductor substrate 102, and the sealing structural member 130 has such a sealing structure which stores the light emitting element 120 into an internal space 132 which is tightly closed between the semiconductor substrate 102 and the own sealing structural member 130. The sealing structural member 130 can seal the above-described space 132 under air tight condition, since the lower plane of the glass frame 134 is strongly joined by the anode joining with respect to the substrate 102 made of silicon. As a consequence, while the light emitting element 120 may be protected by the sealing structural member 130 in such a manner that dust and the like are not attached to a light emitting plane 120A, light emitted from the light emitting plane 120A passes through the glass plate 136 and then is projected upwardly.

[Embodiment 3]

Figure 7A:
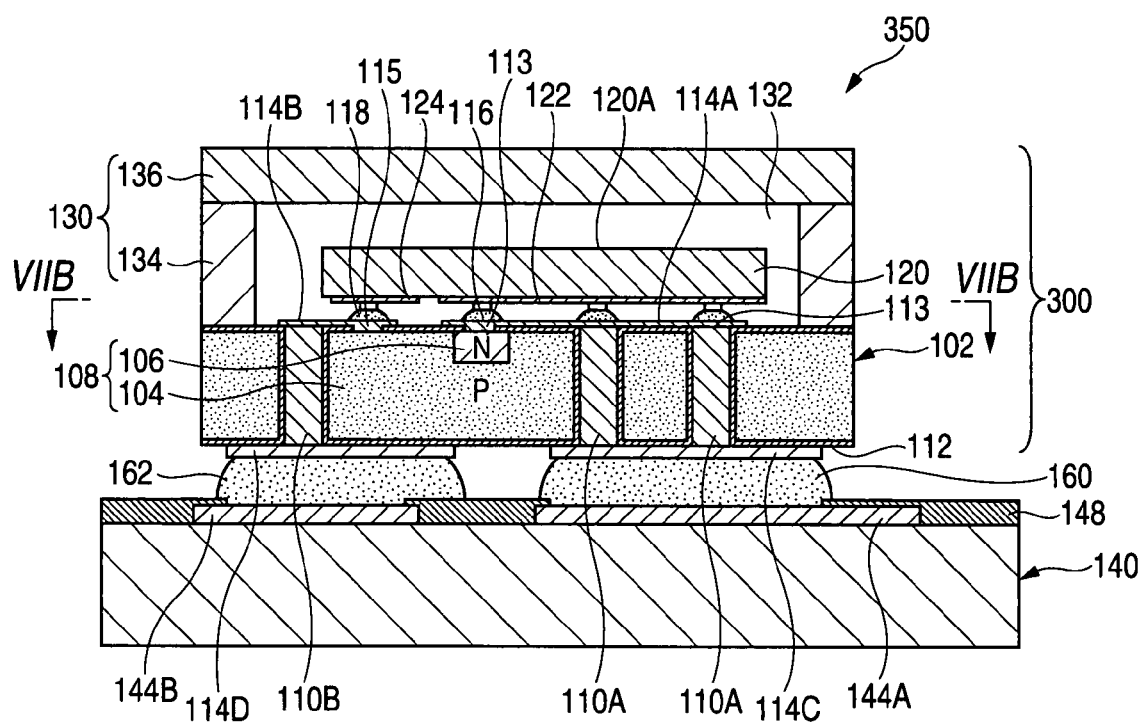
FIG. 7A is a longitudinal sectional view for showing an embodiment 3 of a semiconductor device according to the present invention.
Figure 7B:
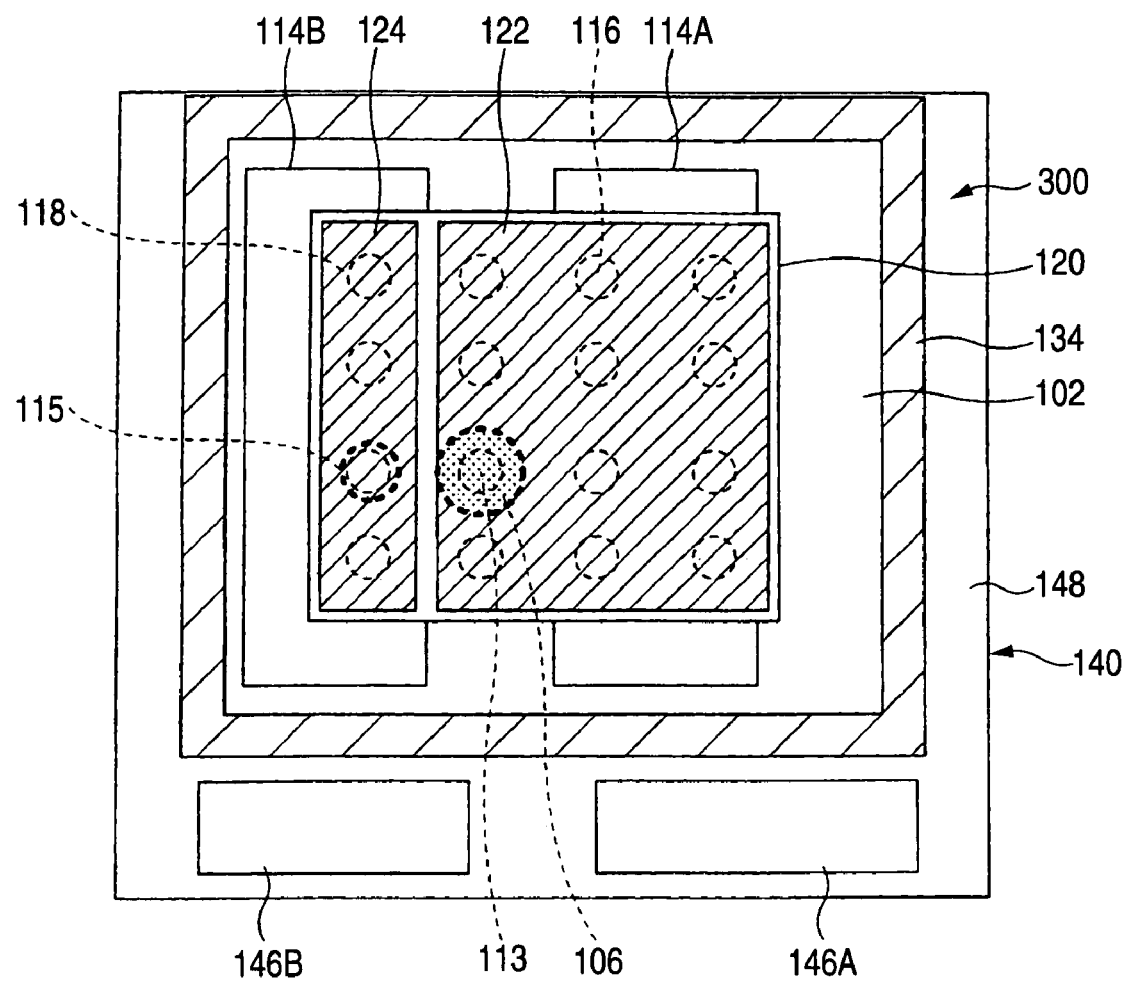
FIG. 7B is a lateral sectional view for indicating the semiconductor device, taken along a line VIIB-VIIB indicated in FIG. 7A.

FIG. 7A is a longitudinal sectional view for representing an embodiment 3 of a semiconductor device 300 according to the present invention. FIG. 7B is a lateral sectional view of the semiconductor device 300, taken along a line VIIB-VIIB shown in FIG. 7A. It should be understood that in FIG. 7A and FIG. 7B, the same reference numerals of the above-described embodiments 1 and 2 will be employed as those for denoting the same structural elements, and descriptions thereof are omitted.

As indicated in FIG. 7A and FIG. 7B, in the semiconductor device 300 of the embodiment 3, an N layer 106 and an N layer connecting portion 113 have been formed in the vicinity of a center of an upper plane of the semiconductor substrate 102. Then, a region where the N layer 106 is formed is provided on the side of a mounting plane (namely, upper plane side shown in FIG. 7A) on which the light emitting element 120 is mounted, and has been formed in the vicinity of a left-sided peripheral portion of the electrode 122.

In the mounted structure 350 in which the semiconductor device 300 is mounted on the mother board 140, the P layer 104 and the N layer 106, which form the zener diode 108, have been connected to the connection terminals 144A and 144B of the mother board 140 in such a manner that the P layer 104 and the N layer 106 are provided parallel to the light emitting element 120. As a consequence, a voltage may be stabilized by the zener diode 108 parallel-connected with respect to the light emitting element 120, for instance, it is possible to avoid that a high voltage caused by electrostatic energy, and the like is applied to the light emitting element 120.

Accordingly, in the arrangement of the embodiment 3, the N layer 106 has been formed between a penetration electrode 110A and another penetration element 110B, and furthermore, both the N layer connecting portion 113 which is electrically connected to the N layer 106, and a P layer connecting portion 115 which is electrically connected to a P layer 104 have been formed at positions close to each other. As a result, in the embodiment 3, the penetration electrode 110A and the penetration electrode 110B can be separated from each other longer than those of the above-described embodiments 1 and 2, and thus, a resistance value of the zener diode 108 can be set to a different value from the resistance values of the zener diodes 108 of the embodiments 1 and 2 based upon the separation difference between the penetration electrodes 110A and 110B.

[Embodiment 4]

Figure 8A:
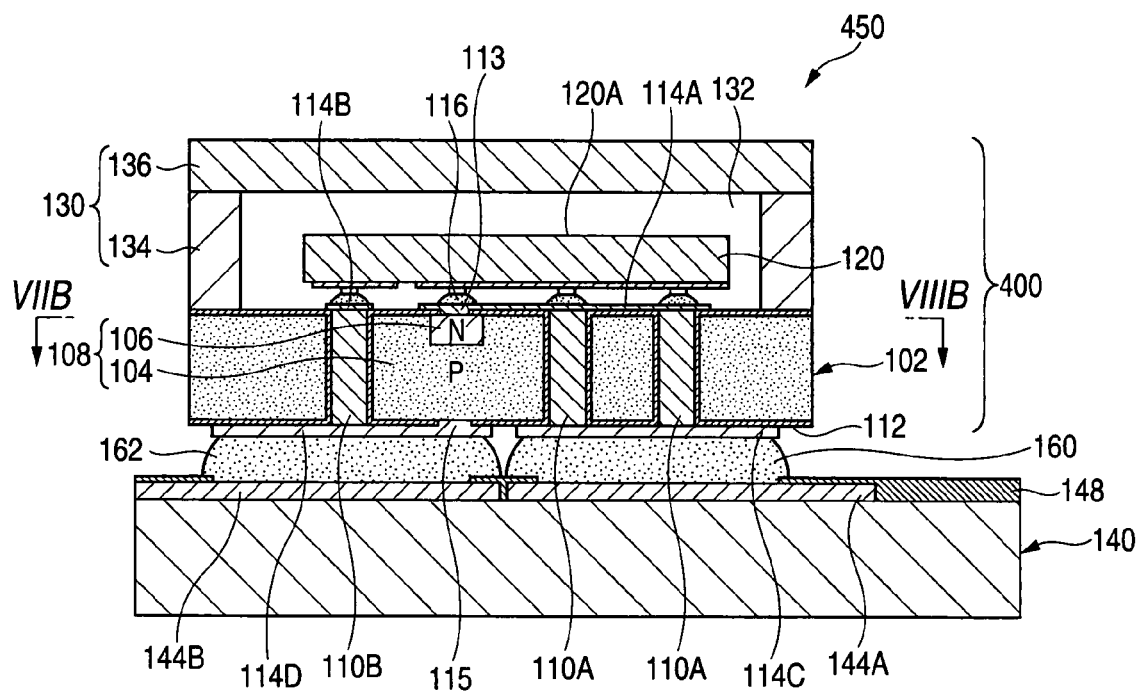
FIG. 8A is a longitudinal sectional view for showing an embodiment 4 of a semiconductor device according to the present invention.
Figure 8B:
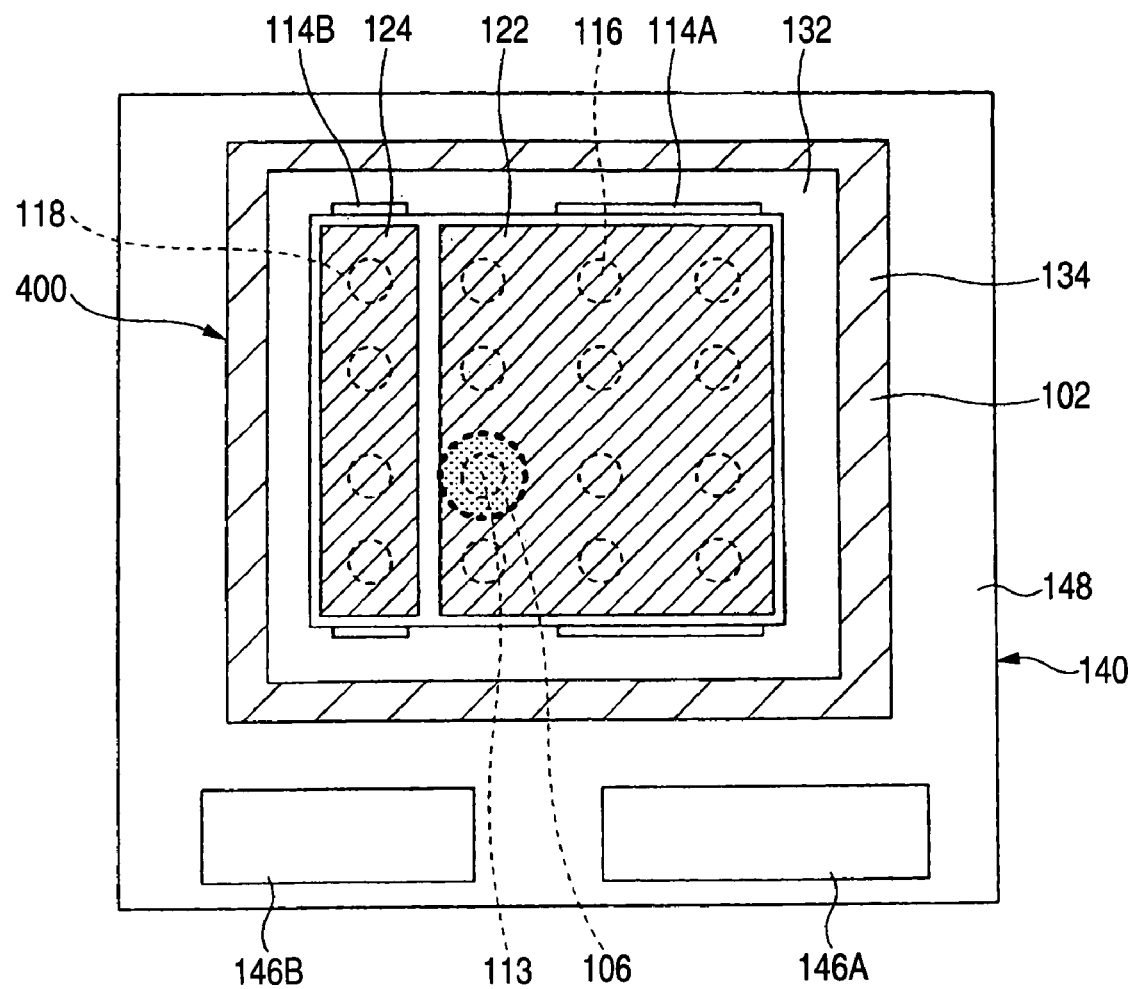
FIG. 8B is a lateral sectional view for indicating the semiconductor device, taken along a line VIIIB-VIIIB indicated in FIG. 8A.

FIG. 8A is a longitudinal sectional view for representing an embodiment 4 of a semiconductor device 400 according to the present invention. FIG. 8B is a lateral sectional view of the semiconductor device 400, taken along a line VIIIB-VIIIB shown in FIG. 8A. It should be understood that in FIG. 8A and FIG. 8B, the same reference numerals of the above-described embodiments 1 to 3 will be employed as those for denoting the same structural elements, and descriptions thereof are omitted.

As indicated in FIG. 8A and FIG. 8B, in the semiconductor device 400 of the embodiment 4, an N layer 106 and an N layer connecting portion 113 have been formed in the vicinity of a center of an upper plane of the semiconductor substrate 102. Then, a P layer connecting portion 115 of a P layer 104 has been formed in the vicinity of a center of a lower plane of the semiconductor substrate 102, which is located opposite to the upper plane where the N layer connecting portion 113 has been formed. The N layer connecting portion 113 and the P layer connecting portion 115 have been provided at positions on the same vertical line. As a result, the P layer 104 is connected not via a penetration electrode 110B, but via the P layer connecting portion 115 and a wiring layer 114D on the side of the lower plane, and a solder bump 162 to a connection terminal 144B of a mother board 140.

As explained with respect to the equivalent circuit shown in FIG. 4C, in the mounted structure 450 in which the semiconductor device 400 is mounted on the mother board 140, the P layer 104 and the N layer 106, which form the zener diode 108, have been connected to the connection terminals 144A and 144B of the mother board 140 in such a manner that the P layer 104 and the N layer 106 are provided parallel to the light emitting element 120. As a consequence, a voltage may be stabilized by the zener diode 108 parallel-connected with respect to the light emitting element 120, for instance, it is possible to avoid that a high voltage caused by electrostatic energy, and the like is applied to the light emitting element 120.

In this embodiment 4, there is no need that either the P layer connecting portion 115 or the penetration electrode 110B is arranged outside the region where the light emitting element 120 is mounted, which is required in the above-described embodiment 3. As a result, the semiconductor device 400 of this embodiment 4 can be made more compact than that of the above-described embodiment 3, and furthermore, the installation space thereof can be reduced, as compared with that of the embodiment 3.

[Embodiment 5]

FIG. 9A is a longitudinal sectional view for representing an embodiment 5 of a semiconductor device 500 according to the present invention. FIG. 9B is a lateral sectional view of the semiconductor device 500, taken along a line IXB-IXB shown in FIG. 9A. It should be understood that in FIG. 9A and FIG. 9B, the same reference numerals of the above-described embodiments 1 to 4 will be employed as those for denoting the same structural elements, and descriptions thereof are omitted.

As indicated in FIG. 9A and FIG. 9B, in the semiconductor device 500 of the embodiment 5, such a type of light emitting element 520 which is wire-bonded to an upper plane thereof has been mounted on a semiconductor substrate 102. An electrode 522 and another electrode 524 have been formed on the light limiting element 520, while wires 530 and 540 are bonded on upper planes of these electrodes 522 and 524. Furthermore, wiring layers 114A and 114B to which edge portions of the wires 530 and 540 are connected, and another wiring layer 114E have been formed on the semiconductor substrate 102. The wiring layer 114E is connected to a P layer connecting portion 115 which is electrically connected to a P layer 104.

In the mounted structure 550 in which the semiconductor device 500 is mounted on the mother board 140, the respective wiring layers 114A, 114B, 114E are connected via penetration electrodes 110 to wiring layers 114C and 114D provided on the side of the lower plane of the semiconductor substrate 102 respectively, and are connected via solder bumps 160 and 162 to connection terminals 144A and 144B of the mother board 140. It should be noted that a solder bump 163 arranged on the lower plane side of the semiconductor substrate 102 is to hold a right edge side of the semiconductor substrate 102 under stable condition.

Also, the light emitting element 520 has been fixed on the semiconductor substrate 102 by an adhesive layer 560. Then, the P layer connecting portion 115 of the P layer 104 is connected via the wiring layer 114D and the bump 162 to the connection terminal 144B of the mother board 140, while the wiring layer 114D and the solder bump 162 are arranged via the penetration electrode 110B on the lower plane side of the semiconductor substrate 102. Also, the N layer connecting portion 113 of the N layer 106 is connected via the wiring layer 114C and the bump 160 to the connection terminal 144A of the mother board 140, while the wiring layer 114C and the solder bump 160 are arranged via the penetration electrode 110A on the lower plane side of the semiconductor substrate 102. As a consequence, the P layer 104 and the N layer 106 are connected to the connection terminals 144A and 144B of the mother board 140 in such a way that the P layer 104 and the N layer 106 are arranged parallel to the light emitting element 520. As a result, a voltage may be stabilized by the zener diode 108 parallel-connected with respect to the light emitting element 520, for instance, it is possible to avoid that a high voltage caused by electrostatic energy, and the like is applied to the light emitting element 520.

[Embodiment 6]

Figure 10A:
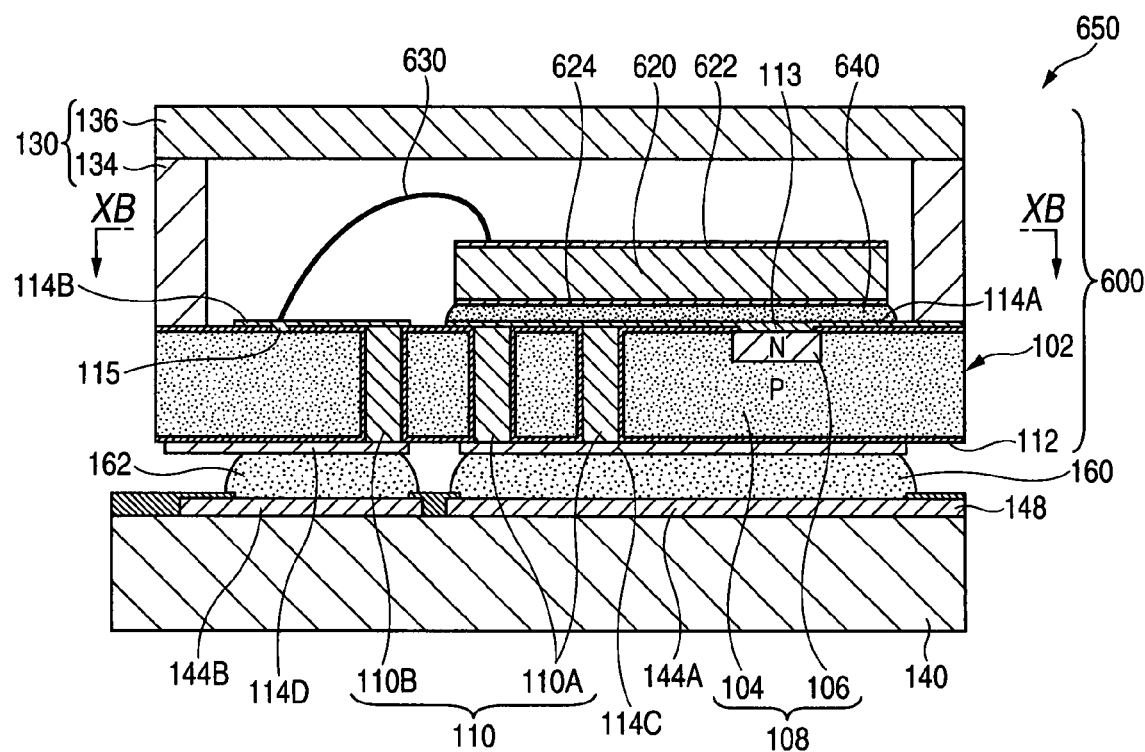
FIG. 10A is a longitudinal sectional view for showing an embodiment 6 of a semiconductor device according to the present invention.
Figure 10B:
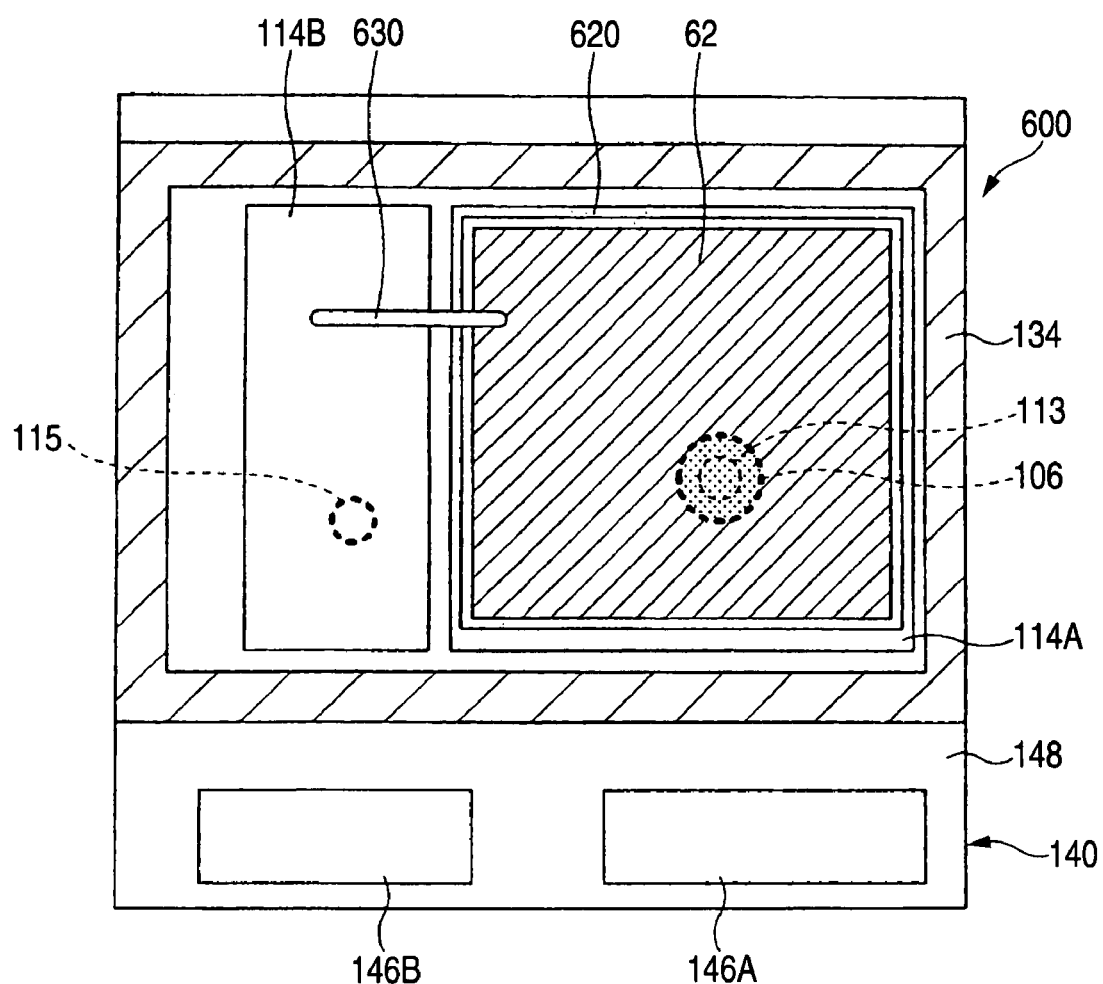
FIG. 10B is a lateral sectional view for indicating the semiconductor device, taken along a line XB-XB indicated in FIG. 10A.

FIG. 10A is a longitudinal sectional view for representing an embodiment 6 of a semiconductor device 600 according to the present invention. FIG. 10B is a lateral sectional view of the semiconductor device 600, taken along a line XB-XB shown in FIG. 10A. It should be understood that in FIG. 10A and FIG. 10B, the same reference numerals of the above-described embodiments 1 to 5 will be employed as those for denoting the same structural elements, and descriptions thereof are omitted.

As indicated in FIG. 10A and FIG. 10B, in the semiconductor device 600 of the embodiment 6, such a type of light emitting element 620 which is wire-bonded only to a P layer on an upper plane thereof has been mounted on a semiconductor substrate 102. An electrode 622 has been formed in the light emitting element 620, while a wire 630 is bonded on upper planes of the electrode 622. This electrode 622 is connected via the wire 630 to a wiring layer 114B, and is furthermore connected via a wiring layer 114D and a solder bump 162 to a connection terminal 144B of the mother board 140. The wiring layer 114D and the solder bump 162 are arranged via a penetration electrode 110B on the lower plane side of the semiconductor substrate 102.

Also, an electrode 624 has been formed on a lower plane of the light emitting element 620, and is connected to the wiring layer 114A by a conductive adhesive layer 640. This electrode 624 is connected via the wiring layer 114A to the N layer 106, and is furthermore connected via a wiring layer 114C and a solder bump 160 to a connection terminal 144A of the mother board 140. The wiring layer 114C and the solder bump 160 are arranged via a penetration electrode 110A on the lower plane side of the semiconductor substrate 102.

In the mounted structure 650 in which the semiconductor device 600 is mounted on the mother board 140, the P layer 104 and the N layer 106, which form the zener diode 108, have been connected to the connection terminals 144A and 144B of the mother board 140 in such a manner that the P layer 104 and the N layer 106 are provided parallel to the light emitting element 620. As a consequence, a voltage maybe stabilized by the zener diode 108 parallel-connected with respect to the light emitting element 620, for instance, it is possible to avoid that a high voltage caused by electrostatic energy, and the like is applied to the light emitting element 620.

While the preferred embodiments of the present invention have been described, the present invention is not limited only to the above-explained specific embodiments, but maybe modified as well as changed within the gist described in the scope of claims.

In the above-described embodiments, such a case that light emitting elements are mounted on semiconductor substrates has been exemplified. Apparently, the present invention is not limited only to this exemplification, but may be alternatively applied to such a structure that various types of electronic components (for example, IC chips and MEMS (Micro Electro Mechanical Systems)) or optical functional elements (for example, light receiving elements and imaging elements such as CCD) other than the light emitting elements are mounted.

Also, the above-described embodiments have exemplified such a case that zener diodes are formed in impurity diffusion regions of the semiconductor substrate. The present invention is not limited only to this exemplification, but may be applied to another structure that an element other than the zener diodes is formed.

Also, the above-described embodiments have exemplified such a method by employing the ion implantation method by which the N type impurity is ionized and the N type impurity ions are doped in the impurity diffusion region. However, the present invention is not limited only to this ion implantation method, but may be alternatively realize by such a manner that, for example, an N layer is formed by a thermal diffusion method.

Also, the above-described embodiments have exemplified such a method that the N type impurity is doped in the P type impurity diffusion region of the semiconductor substrate. However, the present invention is not limited only to this doping method, but may be alternatively realized by such a manner that, for example, a P type impurity is doped in an N type impurity diffusion region of a semiconductor substrate.

What is claimed is:

1. A semiconductor device comprising:
a substrate, the substrate including,
a first wiring layer, and
a second wiring layer;
an electronic component;
a first electrode connected to the electronic component;
a second electrode connected to the electronic component;
a first coupling between the first electrode and the first wiring layer; and
a second coupling between the second electrode and the second wiring layer,
wherein
the substrate is a semiconductor substrate;
a region of a semiconductor element formed in an impurity diffusion region of the semiconductor substrate is electrically connected to the electronic component;
a plurality of penetration electrodes, which are electrically connected to the electronic component, formed in the semiconductor substrate, the plurality of penetration electrodes including a first penetration electrode and a second penetration electrode, with the first penetration electrode being connected to the first wiring layer and the second penetration electrode being connected to the second wiring layer;
the first wiring layer which is formed on a surface of the semiconductor substrate facing the electronic component and over the first penetration electrode, and which connects a first region of the semiconductor element to the first penetration electrode and the first electrode of the electronic component,
the second wiring layer which is formed on the surface of the semiconductor substrate facing the electronic component and over the second penetration electrode, and which connects a second region of the semiconductor element to the second penetration electrode and the second electrode of the electronic component; and
a protection film formed on an entire surface of the semiconductor substrate, including on an inner wall of a hole in the semiconductor substrate, such that the first wiring layer, the second wiring layer, the first penetration electrode and the second penetration electrode are formed on the semiconductor substrate via the protection film,
wherein the first wiring layer is connected to the first region of the semiconductor element via a first connecting portion, wherein the first connecting portion is formed in the protection film formed on the surface of the semiconductor substrate facing the electronic component,
wherein the second wiring layer is connected to the second region of the semiconductor element via a second connecting portion, wherein the second connecting portion is formed in the protection film formed on the surface of the semiconductor substrate facing the electronic component,
wherein the first penetration electrode is opposed to the first electrode, and
wherein the second penetration electrode is opposed to the second electrode.

2. The semiconductor device as claimed in claim 1, wherein
the semiconductor element is formed by at least two regions having different conductivity types.

3. The semiconductor device as claimed in claim 1, wherein
the semiconductor element is a zener diode capable of avoiding a voltage higher or equal to a predetermined voltage applied to the electronic component.

4. The semiconductor device as claimed in claim 1, wherein the first penetration electrode is connected to a third wiring layer formed on a second surface opposite the surface of the semiconductor substrate facing the electronic component, and the second penetration electrode is connected to a fourth wiring layer formed on the second surface opposite the surface of the semiconductor substrate facing the electronic component.

5. The semiconductor device as claimed in claim 1, wherein
the semiconductor substrate is a silicon substrate.

6. The semiconductor device as claimed in claim 1, wherein
the electronic component is sealed on the substrate by a sealing structural member provided with an optical transmitting plane having an optical transmitting characteristic.

7. The semiconductor device as claimed in claim 1, further comprising:
a third penetration electrode; and
a third electrode connected to the electronic component,
wherein the third penetration electrode is connected to the third electrode of the electronic component and the first region of the semiconductor element via the first wiring layer.

8. The semiconductor device as claimed in claim 1, wherein the protection film includes an insulating film.

9. A substrate, comprising:
a semiconductor element formed by a first region and a second region which have different conductivity types;
a first penetration electrode electrically connected to the first region of the semiconductor element;
a second penetration electrode electrically connected to the second region of the semiconductor element;
a first wiring layer which is formed on a surface of the substrate adapted to face an electronic component and over the first penetration electrode, and which connects the first region of the semiconductor element to the first penetration electrode and a first electrode connected to the electronic component, a second wiring layer which is formed on the surface of the substrate adapted to face the electronic component and over the second penetration electrode, and which connects the second region of the semiconductor element to the second penetration electrode and a second electrode connected to the electronic component; and a protection film formed on an entire surface of the substrate, including on an inner wall of a hole in the substrate, such that the first wiring layer, the second wiring layer, the first penetration electrode and the second penetration electrode are formed on the substrate via the protection film, wherein the first wiring layer is connected to the first region of the semiconductor element via a first connecting portion, wherein the first connecting portion is formed in the protection film formed on the surface of the semiconductor substrate adapted to face the electronic component, wherein the second wiring layer is connected to the second region of the semiconductor element via a second connecting portion, wherein the second connecting portion is formed in the protection film formed on the surface of the semiconductor substrate adapted to face the electronic component, wherein the first penetration electrode is opposed to the first electrode, and wherein the second penetration electrode is opposed to the second electrode.

10. The substrate as claimed in claim 9, wherein the first penetration electrode is connected to a third wiring layer formed on a second surface opposite the surface of the substrate adapted to face the electronic component, and the second penetration electrode is connected to a fourth wiring layer formed on the second surface opposite the surface of the substrate adapted to face the electronic component.

11. The substrate as claimed in claim 9, further comprising a third penetration electrode; and a third electrode connected to the electronic component, wherein the third penetration electrode is connected to the third electrode and the first region of the semiconductor element via the first wiring layer.

12. The substrate as claimed in claim 9, wherein the protection film includes an insulating film.

* * * * *